United States Patent [19]
Hirabayashi et al.

[11] Patent Number: 6,118,729
[45] Date of Patent: Sep. 12, 2000

[54] SYNCHRONOUS SEMICONDUCTOR MEMORY DEVICE

[75] Inventors: Osamu Hirabayashi; Atsushi Kawasumi, both of Yokohama, Japan

[73] Assignee: Kabushiki Kaisha Toshiba, Kawasaki, Japan

[21] Appl. No.: 09/179,675

[22] Filed: Oct. 27, 1998

[30] Foreign Application Priority Data

Oct. 28, 1997 [JP] Japan .................................. 9-295431
Jun. 8, 1998 [JP] Japan .................................. 10-159381

[51] Int. Cl.$^7$ ...................................................... G11C 8/00
[52] U.S. Cl. ..................................... 365/233; 365/189.05
[58] Field of Search ............................... 365/233, 189.05

[56] References Cited

U.S. PATENT DOCUMENTS

| | | | |
|---|---|---|---|
| 4,897,817 | 1/1990 | Katanosaka | 365/201 |
| 5,793,680 | 8/1998 | Okajima | 365/233 |
| 5,892,730 | 4/1999 | Sato et al. | 365/233 |
| 5,991,233 | 11/1999 | Yu | 365/233 |

FOREIGN PATENT DOCUMENTS 6124586  5/1994  Japan ........................... G11C 11/401

*Primary Examiner*—Andrew Tran
*Assistant Examiner*—Van-Thu Nguyen
*Attorney, Agent, or Firm*—Hogan & Hartson, LLP

[57] ABSTRACT

This invention discloses a synchronous semiconductor memory device based on the DDR scheme. This device includes a memory cell array including first and second memory cell groups, first and second data lines, a data transfer circuit capable of at least respectively connecting memory cells included in the first and second memory cell groups to the first and second data line, a first output transfer circuit for transferring first output data sent to one of the first and second data lines at up-edge and down-edge of an operation clock, a second output transfer circuit for transferring second output data sent to the other of the first and second data lines at the up-edge and down-edge of the operation clock, and a data line control circuit capable of selectively connecting the first data line to one of the first and second output transfer circuits and selectively connecting the second data line to one of the first and second output transfer circuits.

28 Claims, 29 Drawing Sheets

FIG. 8A

LINER MODE (SDR)

| CLOCK CYCLE | 1 | 2 | 3 | 4 | 5 | ... |
|---|---|---|---|---|---|---|
| (A1, A0) | (0, 0) → | (0, 1) → | (1, 0) → | (1, 1) → | (0, 0) → | ... |
|  | (0, 1) → | (1, 0) → | (1, 1) → | (0, 0) → | (0, 1) → | ... |
|  | (1, 0) → | (1, 1) → | (0, 0) → | (0, 1) → | (1, 0) → | ... |
|  | (1, 1) → | (0, 0) → | (0, 1) → | (1, 0) → | (1, 1) → | ... |

START ADDRESS

FIG. 8B

INTERLEAVED MODE (SDR)

| CLOCK CYCLE | 1 | 2 | 3 | 4 | 5 | ... |
|---|---|---|---|---|---|---|
| (A1, A0) | (0, 0) → | (0, 1) → | (1, 0) → | (1, 1) → | (0, 0) → | ... |
|  | (0, 1) → | (0, 0) → | (1, 1) → | (1, 0) → | (0, 1) → | ... |
|  | (1, 0) → | (1, 1) → | (0, 0) → | (0, 1) → | (1, 0) → | ... |
|  | (1, 1) → | (1, 0) → | (0, 1) → | (0, 0) → | (1, 1) → | ... |

START ADDRESS

FIG. 8C

LINER MODE (DDR)

| CLOCK CYCLE | 1 | 2 | 3 | ... |
|---|---|---|---|---|
| (A1, A0) | (0, 0) & (0, 1) → | (1, 0) & (1, 1) → | (0, 0) & (0, 1) → | ... |
|  | (0, 1) & (1, 0) → | (1, 1) & (0, 0) → | (0, 1) & (1, 0) → | ... |
|  | (1, 0) & (1, 1) → | (0, 0) & (0, 1) → | (1, 0) & (1, 1) → | ... |
|  | (1, 1) & (0, 0) → | (0, 1) & (1, 0) → | (1, 1) & (0, 0) → | ... |

START ADDRESS

FIG. 8D

INTERLEAVED MODE (DDR)

| CLOCK CYCLE | 1 | 2 | 3 | ... |
|---|---|---|---|---|
| (A1, A0) | (0, 0) & (0, 1) → | (1, 0) & (1, 1) → | (0, 0) & (0, 1) → | ... |
|  | (0, 1) & (0, 0) → | (1, 1) & (1, 0) → | (0, 1) & (0, 0) → | ... |
|  | (1, 0) & (1, 1) → | (0, 0) & (0, 1) → | (1, 0) & (1, 1) → | ... |
|  | (1, 1) & (1, 0) → | (0, 1) & (0, 0) → | (1, 1) & (1, 0) → | ... |

START ADDRESS

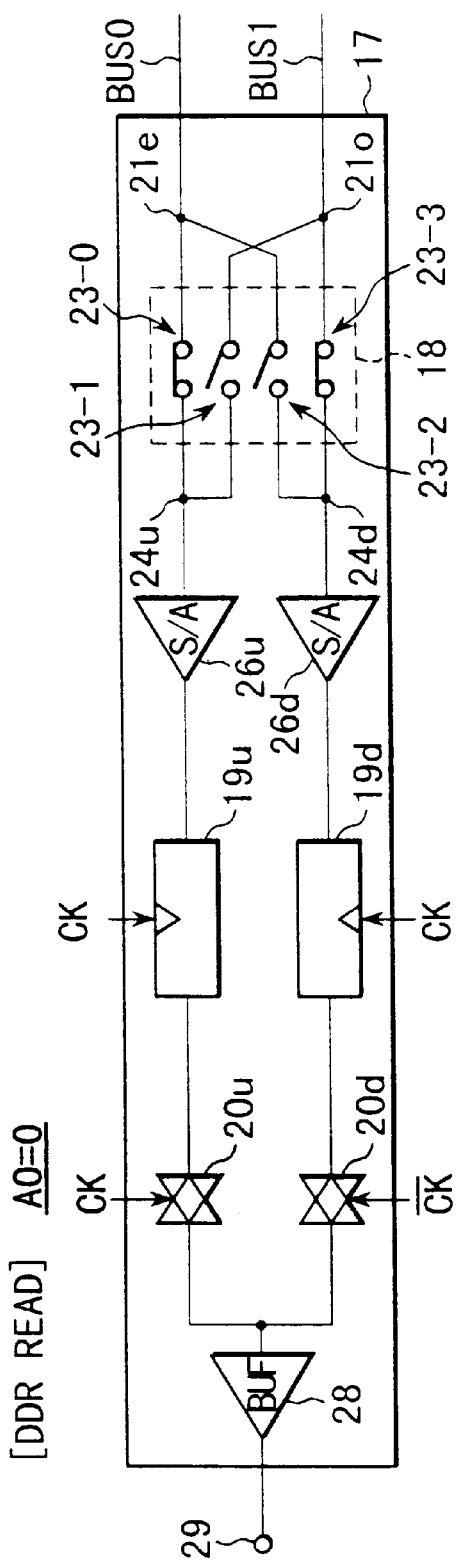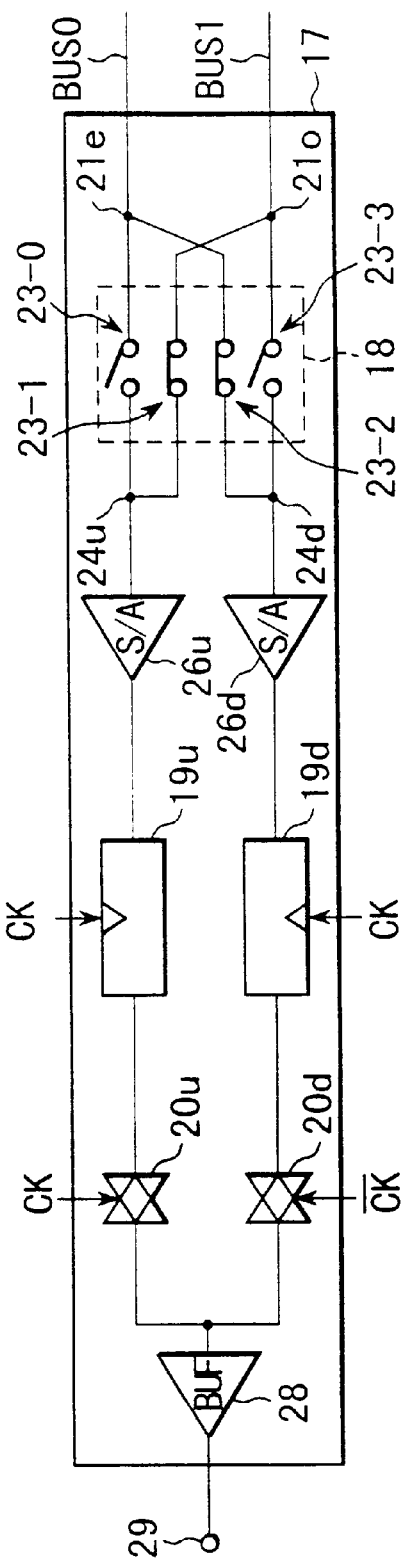

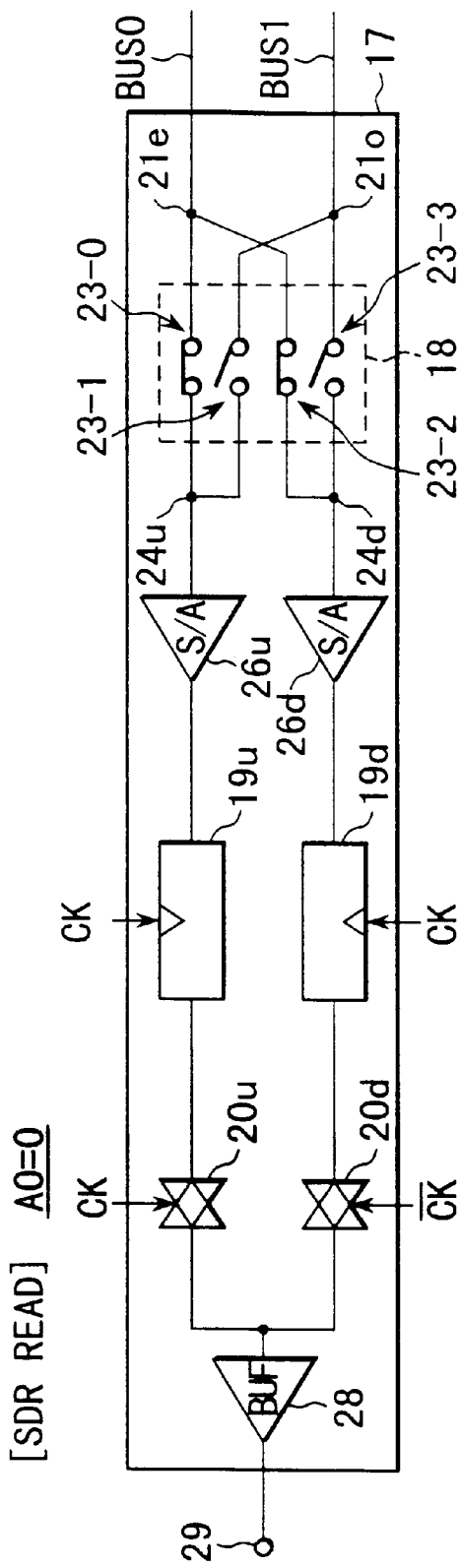
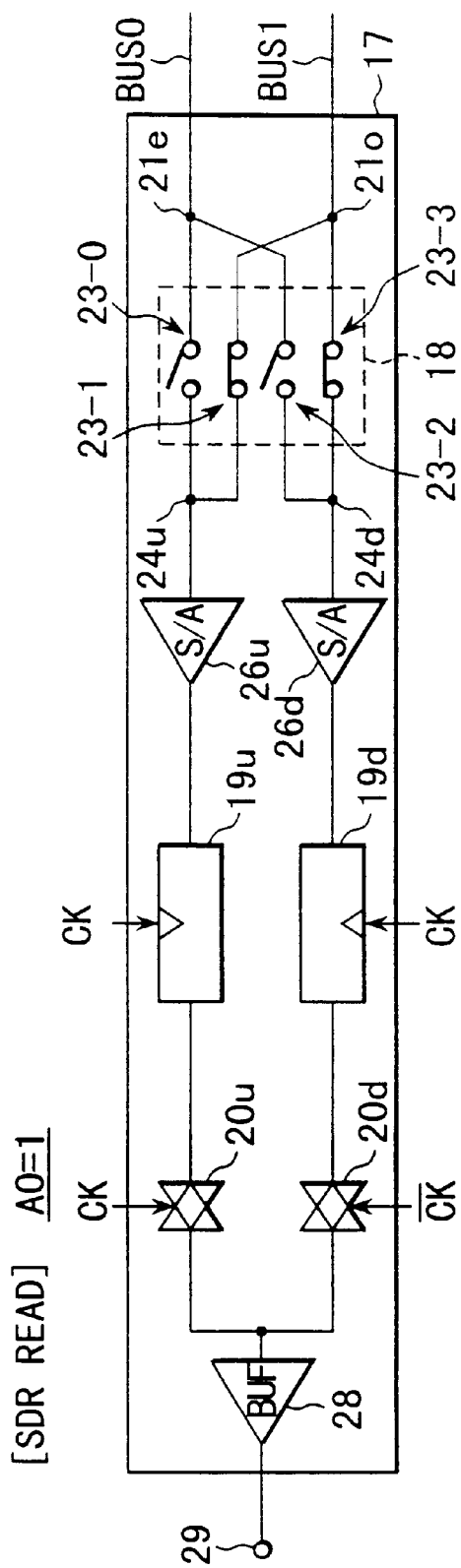

SYNCHRONOUS SEMICONDUCTOR MEMORY DEVICE

BACKGROUND OF THE INVENTION

The present invention relates to a synchronous semiconductor memory based on the double data rate (to be referred to as DDR hereinafter) scheme, which is used for, for example, a static RAM.

A general synchronous semiconductor device is read or written in synchronism with the up-edge of an operation clock. In this specification, a synchronous semiconductor memory of this type will be referred to as a single data rate (SDR) scheme memory. A synchronous semiconductor memory based on the SDR scheme is read or written once per operation clock cycle.

Aside from such SDR scheme, a synchronous semiconductor memory based on the DDR scheme has recently received attention.

A synchronous semiconductor memory based on the DDR scheme is read or written in synchronism with both the up-edge and down-edge of an operation clock instead of its up-edge alone. That is, data is read or written twice per operation clock cycle. This can increase the data transfer rate to twice that of the SDR scheme, and is advantageous for an increase in data transfer amount per unit time.

Attempts have also been made to develop a memory in which both the DDR scheme and the SDR scheme are implemented on one chip, and one of the schemes can be selected in accordance with a command signal. A memory of this type is read/written by the DDR scheme when the DDR scheme is ordered, and is read/written by the SDR scheme when the SDR scheme is ordered.

FIG. 1 is a block diagram showing a synchronous SRAM that can select either the DDR scheme or the SDR scheme.

As shown in FIG. 1, an address ADD is input to an address register 101. The address register 101 outputs the input address ADD in synchronism with the up-edge of an operation clock CK. The address ADD outputted from the address register 101 are input to an SRAM core 102. One of the memory cells (not shown) included in the SRAM core 102 which corresponds to the input address signals ADD are connected to data line BUS0 or BUS1 (SDR scheme). In the DDR scheme, two memory cells are designated by the single address ADD. One of the two designated memory cells is connected to one of the data line BUS0, and the other memory cell is connected to the data line BUS1. This specification is based on the premise that a least significant bit A0 of the address ADD determines whether to connect the corresponding memory cell to the data line BUS0 or BUS1. This applies to both the SDR scheme and the DDR scheme. A data output circuit 103 and a data input circuit 104 are connected to the data lines BUS0 and BUS1.

[Data Output Circuit 103]

The data output circuit 103 includes output registers 105-0 and 105-1 and transfer gates 106-0 and 106-1.

The output register 105-0 is connected to the data line BUS0. The output register 105-1 is connected to the data line BUS1. The output register 105-0 stores the data read out to the data line BUS0. The output register 105-1 stores the data read out to the data line BUS1. Each of the output registers 105-0 and 105-1 outputs the stored data in synchronism with the up-edge of the operation clock CK.

The output transfer gate 106-0 is connected to the output register 105-0. The output transfer gate 106-1 is connected to the output register 105-1. The output transfer gate 106-0 outputs the data stored in the output register 105-0 while an output control clock CK1 stays at "H" level. The output transfer gate 106-1 outputs the data stored in the output register 105-1 while an output control clock CK2 stays at "H" level. The output control clock CK2 is a clock that is opposite in phase to the output control clock CK1. These output control clocks CK1 and CK2 are generated by an output control clock generating circuit 107. FIG. 2 shows the output control clocks generated by the output control clock generating circuit 107.

The output control clock generating circuit 107 generates the output control clocks CK1 and CK2 from the operation clock CK and an inverted operation clock /CK that is opposite in phase to the operation clock CK. The output control clock generating circuit 107 includes a frequency-dividing circuit 108, a multiplexer 109, and a clock generating circuit 110. The frequency-dividing circuit 108 doubles the period of the operation clock CK to generate operation clocks 2·CK and 2·/CK each having a period twice that of the operation clock CK. The multiplexer 109 selects either the operation clocks CK and /CK or the operation clocks 2·CK and 2·/CK in accordance with an internal command signal Double/Single. The internal command signal Double/Single is a signal for ordering the DDR or SDR scheme. When the DDR scheme is ordered, the multiplexer 109 selects the operation clocks CK and /CK and supplies them to the clock generating circuit 110. When the SDR scheme is ordered, the multiplexer 109 selects operation clocks 2·CK and 2·/CK and supplies them to the clock generating circuit 110. The clock generating circuit 110 generates the output control clocks CK1 and CK2 in accordance with the least significant bit A0 of the address ADD, as shown in FIG. 2. The least significant bit A0 of the address ADD determines whether the memory cell corresponding to the input address is connected to the data line BUS0 or BUS1.

In this manner, the transfer gates 106-0 and 106-1 are switched/controlled by the output control clocks CK1 and CK2 in accordance with the input address ADD.

[Data Input Circuit 104]

The data input circuit 104 includes input registers 111-0, 111-1, 112-0, and 112-1.

The input register 111-0 outputs the data stored therein while an input control clock CK3 stays at "H" level. The input register 111-1 outputs the data stored therein while an input control clock CK4 stays at "H" level. These input control clocks CK3 and CK4 are generated by an input control clock generating circuit 113. FIG. 3 shows the input control clocks generated by the input control clock generating circuit 113.

The input control clock generating circuit 113 generates the input control clocks CK3 and CK4 from the operation clock CK and the inverted operation clock /CK that is opposite in phase to the operation clock CK. The input control clock generating circuit 113 includes timing adjusting circuits 114 and 115 and a multiplexer 116. The timing adjusting circuit 114 generates a clock CK' that is synchronous with the up-edge of the operation clock CK and has a pulse width shorter than that of the operation clock CK. The timing adjusting circuit 115 generates a clock /CK' that is synchronous with the up-edge of the inverted operation clock /CK and has a pulse width shorter than that of the inverted operation clock /CK. The multiplexer 116 selects the clock CK' or /CK' in accordance with the internal command signal Double/Single and the least significant bit A0 of the address ADD. When the SDR scheme is ordered, the multiplexer 116 selects the clock CK' as the input control clocks CK3 and CK4 regardless of the least significant bit A0 of the address ADD. When the DDR scheme is ordered, the multiplexer 116 selects the clock CK' as one of the input control clocks CK3 and CK4 and also selects the clock /CK as the other of the input control clocks CK3 and CK4 in accordance with the least significant bit A0 of the address ADD.

The input register 112-0 stores an output from the input register 111-0. The input register 112-1 stores an output from the input register 111-1. The input register 112-0 is connected to the data line BUS0. The input register 112-1 is connected to the data line BUS1. Each of the input registers 112-0 and 112-1 outputs the stored data in synchronism with the up-edge of the operation clock CK.

In this way, the input registers 111-0 and 111-1 are switched/controlled by the input control clocks CK3 and CK4 in accordance with the input address ADD.

A burst address counter 117 in FIG. 1 generates a burst address when burst operation is ordered. The burst address counter 117 is activated when an internal command signal Burst is activated. The internal command signal Burst is a signal for ordering burst operation. The burst address counter 117 consecutively converts one address ADD into four burst addresses by incrementing, for example, the two lower bits of the address ADD outputted from the address register 101.

In the above synchronous SRAM, the transfer gates 106-0 and 106-1 and the input registers 111-0 and 111-1 are respectively controlled by the output control clocks CK1 and CK2 and the input control clocks CK3 and CK4, which are generated from the operation clocks CK and /CK. With this control, either the DDR scheme or the SDR scheme can be selected.

Since the clocks CK1, CK2, CK3, and CK4 are generated from the operation clocks CK and /CK, the clocks CK1, CK2, CK3, and CK4 are delayed from the operation clocks CK and /CK. For example, the output control clocks CK1 and CK2 are delayed by a delay time Td1 produced via the output control clock generating circuit 107. For this reason, the output timing of the data is delayed by a delay time Td1 behind the operation clocks CK and /CK.

As shown in FIG. 4, when, after the outputting of the data A4 (least significant bit A0=1), the data B1 (least significant bit A0=1) is subsequently output, the output control clock CK2 is maintained at the "H" level. In this case, the output timing of the data B1 is not delayed by the delay time Td1 behind the operation clocks CK, /CK. And the output time of the data A4 will be shortened to an extent to which the output timing of the data B1 is not delayed.

The input control clocks CK3, CK4 are delayed by a delay time Td2 produced via the input control clock generating circuit 113.

For this reason, as shown in FIG. 5, the outputs timing of the input registers 111-0 and 111-1 are delayed by a delay time Td2 behind the operation clocks CK, /CK.

As shown in FIG. 5, when, after the inputting of the data A4 (least significant bit A0=1), the data B1 (least significant bit A0=1) is subsequently input, it is necessary to set the input control clock CK4 from a "L" level to a "H" level, two times, in one cycle. For this reason, the time at which the input register 111-1 outputs the data A4 will be shortened.

In the case where the frequencies of the operation clocks CK, /CK are raised in order to improve the operation speed, it becomes difficult to adequately obtain the output time of the data at a read operation time or the output time of the input register 111-0 or 111-1 at a read operation time.

BRIEF SUMMARY OF THE INVENTION

It is the first object of the present invention to provide a semiconductor integrated circuit device which can adequately obtain an output time of data at a read operation time.

It is the second object of the present invention to provide a semiconductor integrated circuit device which can adequately obtain an output time of an input register at a write operation time.

In order to achieve the first object, according to the present invention, there is provided a semiconductor integrated circuit device comprising a first output transfer circuit for transferring first output data sent to one of first and second data lines at a first timing, a second output transfer circuit for transferring second output data sent to the other of the first and second data lines at a second timing different from the first timing, and a data line control circuit capable of selectively connecting the first data line to one of the first and second output transfer circuits and selectively connecting the second data line to one of the first and second output transfer circuits.

The above semiconductor integrated circuit device includes a data line control circuit, in particular, which can selectively connect the first data line to one of the first and second output transfer circuits and can selectively connect the second data line to one of the first and second output transfer circuits.

With this arrangement, there is no need to use any output control clock for switching/controlling the first and second output transfer circuits in accordance with an input address ADD. This prevents the data output time from being shortened by the delay time in the circuit for generating this output control clock. It is possible to obtain an adequate data output time.

In order to achieve the second object, according to the present invention, there is provided a semiconductor integrated circuit device comprising a first input register circuit for storing first input data a first timing, a second input register circuit for storing second input data at a second timing different from the first timing, and a data line control circuit capable of selectively connecting the first input register circuit to one of the first and second data lines and selectively connecting the second input register circuit to one of the first and second data lines.

The above semiconductor integrated circuit device includes a data line control circuit, in particular, which can selectively connect the first input register circuit to one of the first and second data lines and can selectively connect the second input register circuit to one of the first and second data lines.

With this arrangement, there is no need to use any input control clock for switching/controlling the first and second input register circuits in accordance with an input address ADD. It is possible to adequately obtain the output times of the first and second input registers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8A is a table showing the burst addresses generated by a burst address counter (in the SDR scheme/linear mode);

FIG. 8B is a table showing the burst addresses generated by the burst address counter (in the SDR scheme/interleaved mode);

FIG. 8C is a table showing the burst addresses generated by a burst address counter (in the DDR scheme/linear mode);

FIG. 8D is a table showing the burst addresses generated by the burst address counter (in the DDR scheme/interleaved mode);

FIGS. 10A and 10B are circuit diagrams each showing the operation of a read data line control circuit (in the DDR scheme);

FIGS. 12A and 12B are circuit diagrams each showing the operation of the read data line control circuit (in the SDR scheme);

DETAILED DESCRIPTION OF THE INVENTION

The embodiments of the present invention will be described in detail below with reference to the views of the accompanying drawing.

[First Embodiment]

Figure 1:
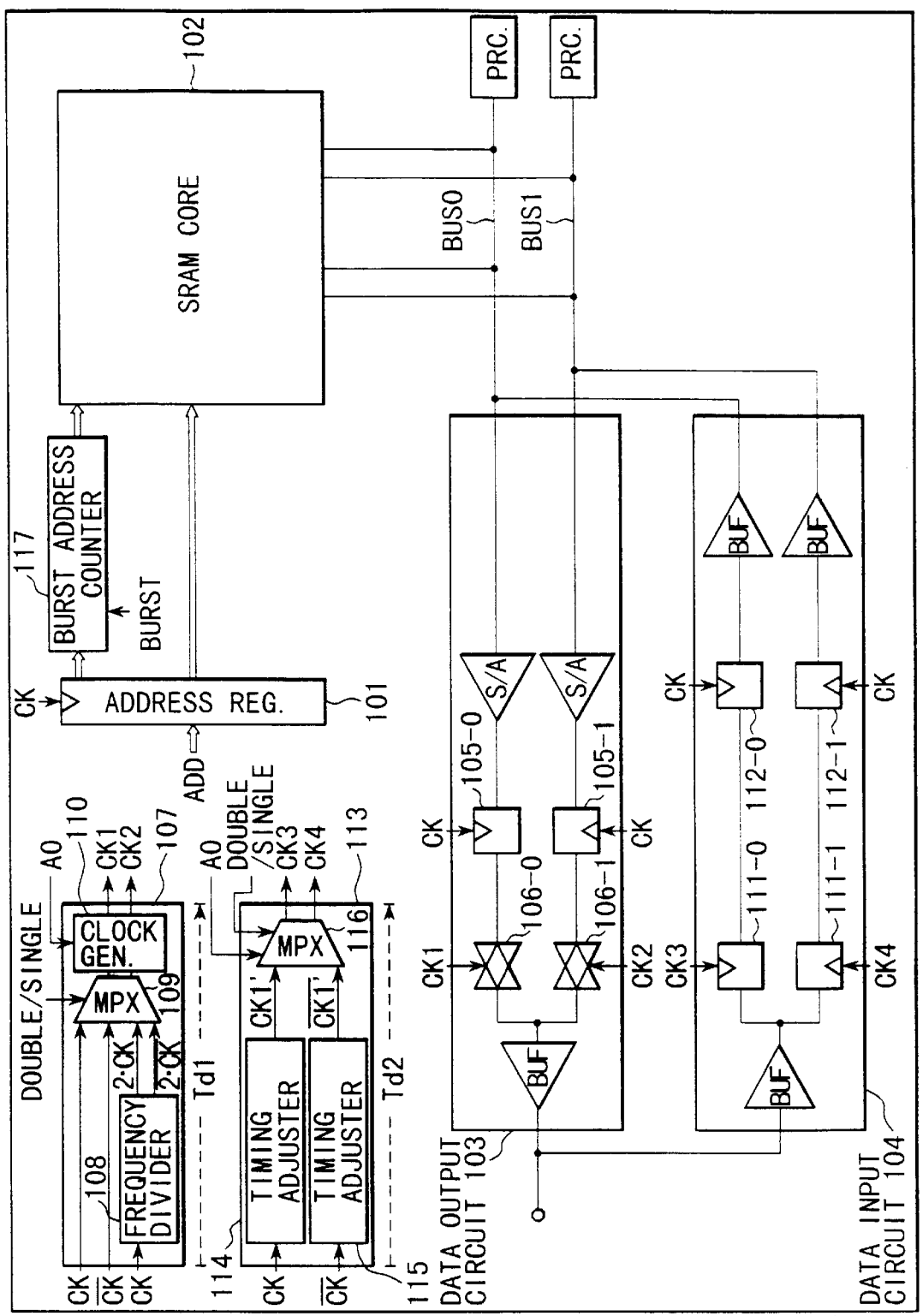
FIG. 1 is a block diagram showing a conventional synchronous SRAM.
Figure 2:
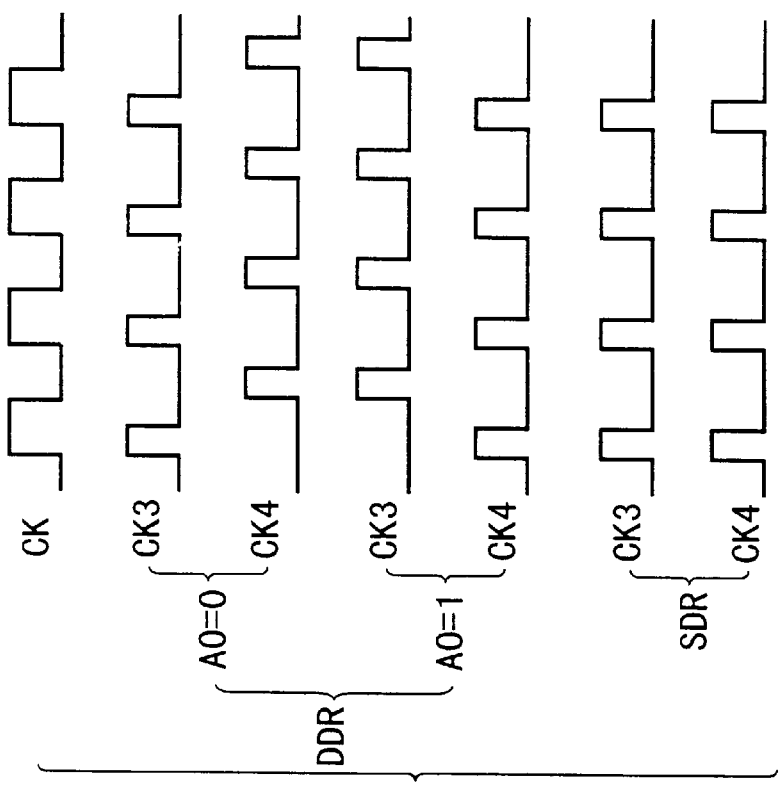
FIG. 2 is a timing chart showing output control clocks.
Figure 3:
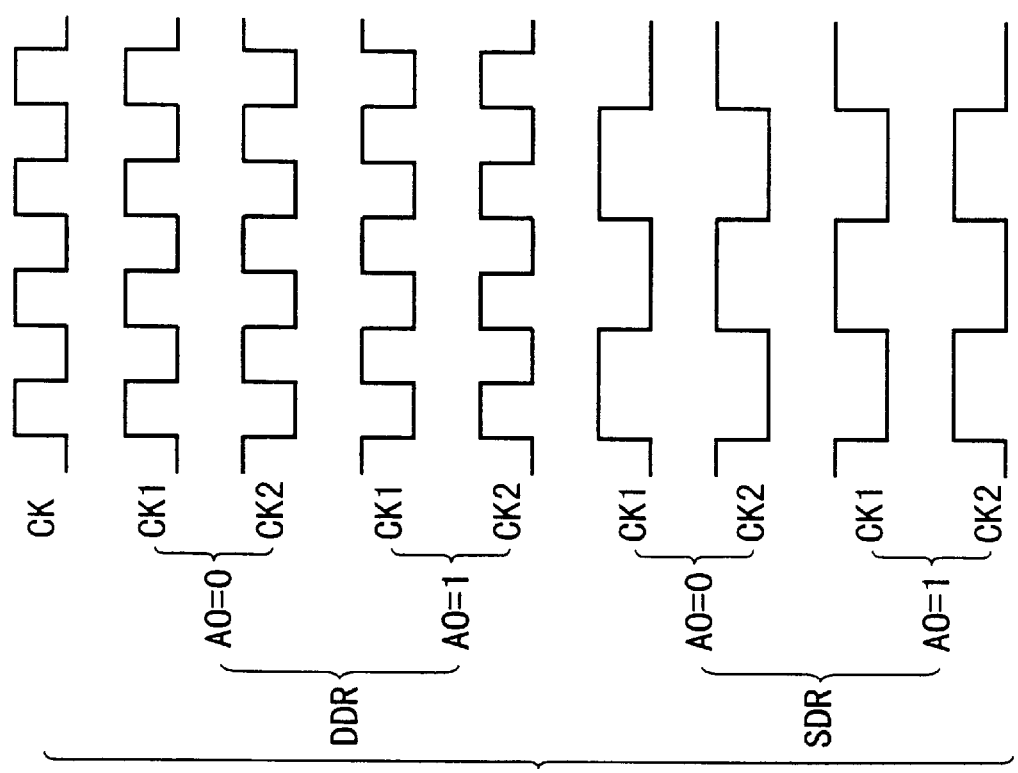
FIG. 3 is a timing chart showing input control clocks.
Figure 4:
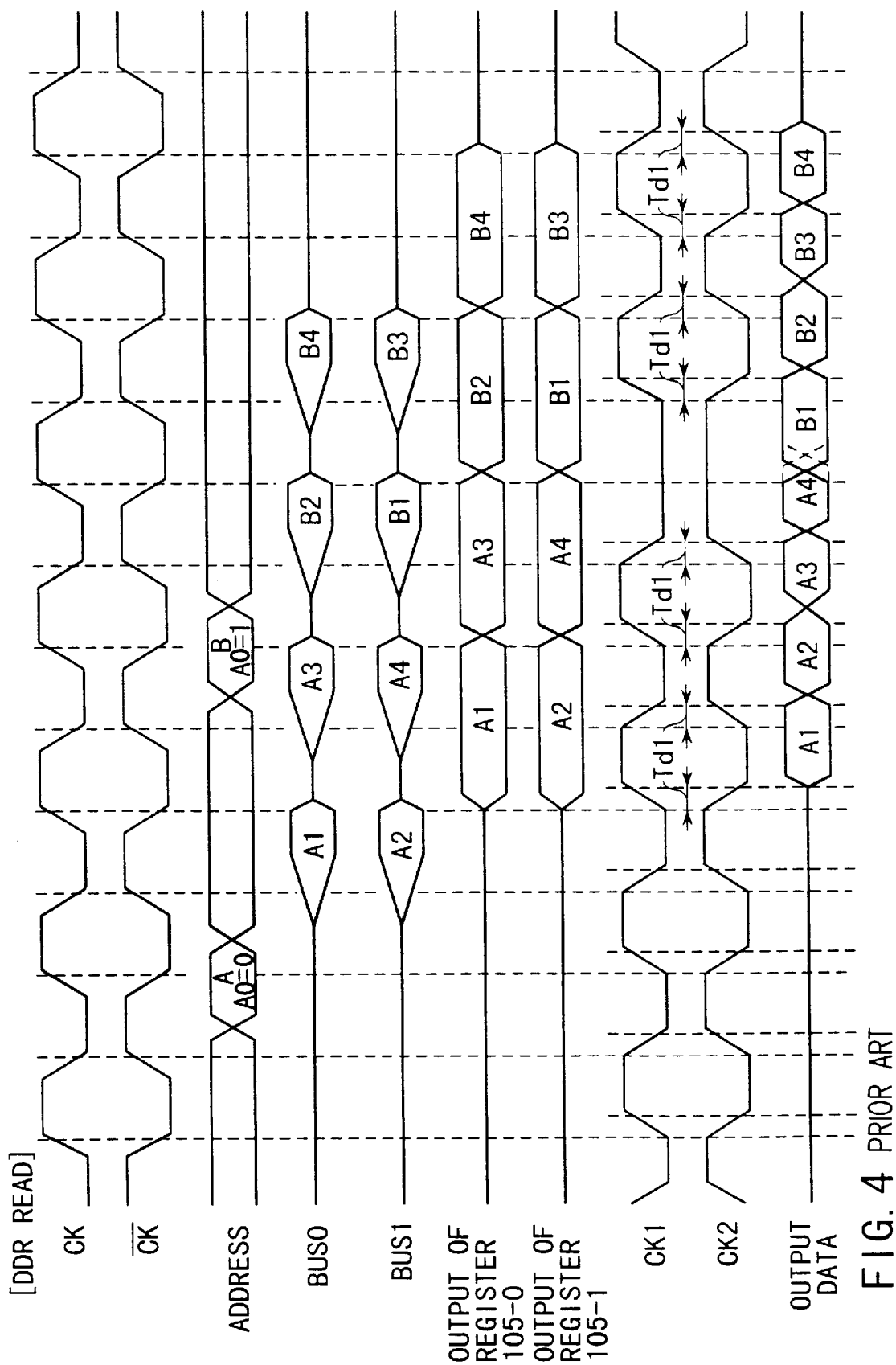
FIG. 4 is a timing chart showing the DDR read operation of a conventional synchronous DRAM.
Figure 5:
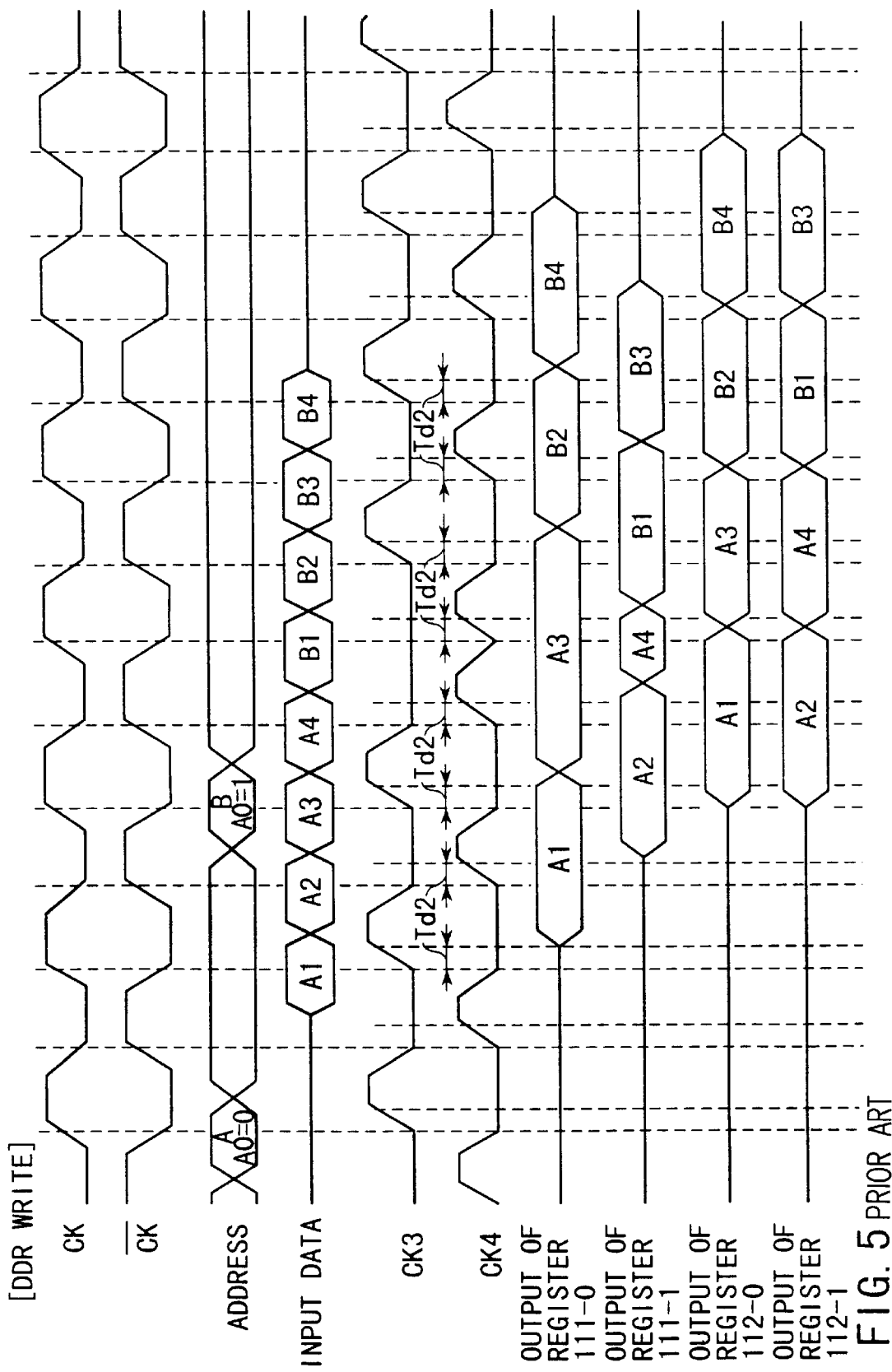
FIG. 5 is a timing chart showing the SDR read operation of a conventional synchronous DRAM.
Figure 6:
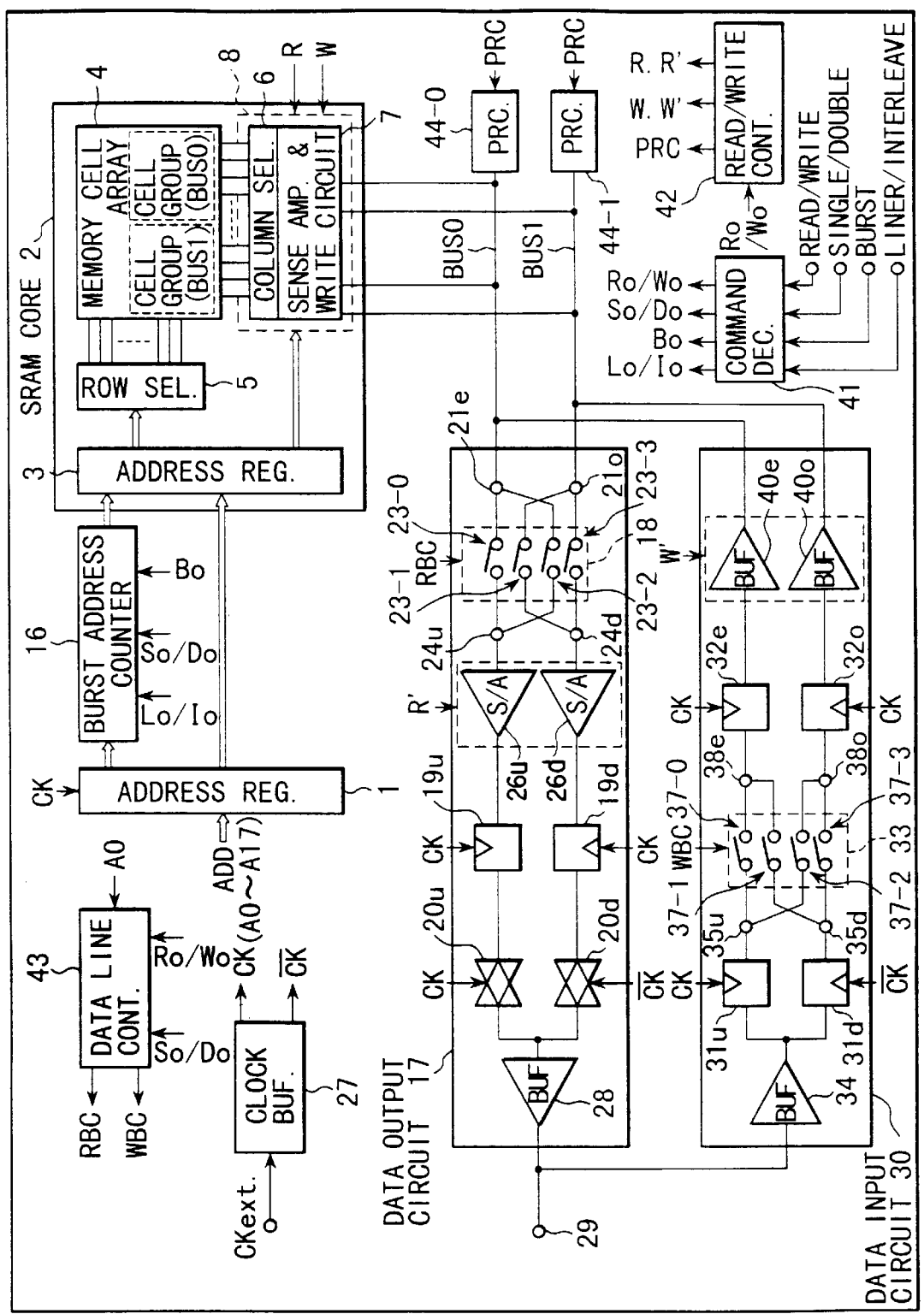
FIG. 6 is a block diagram showing a synchronous SRAM according to the first embodiment of the present invention.

FIG. 6 is a block diagram showing a synchronous SRAM according to the first embodiment of the present invention.

As shown in FIG. 6, an address ADD is input to an address register 1. For example, the address ADD is made up of 18 address signal bits A0 to A17. The address register 1 outputs the input address ADD in synchronism with the up-edge of an operation clock CK. The address ADD outputted from the address register 1 is input to an address decoder 3 of an SRAM core 2.

Figures 7A, 7C:
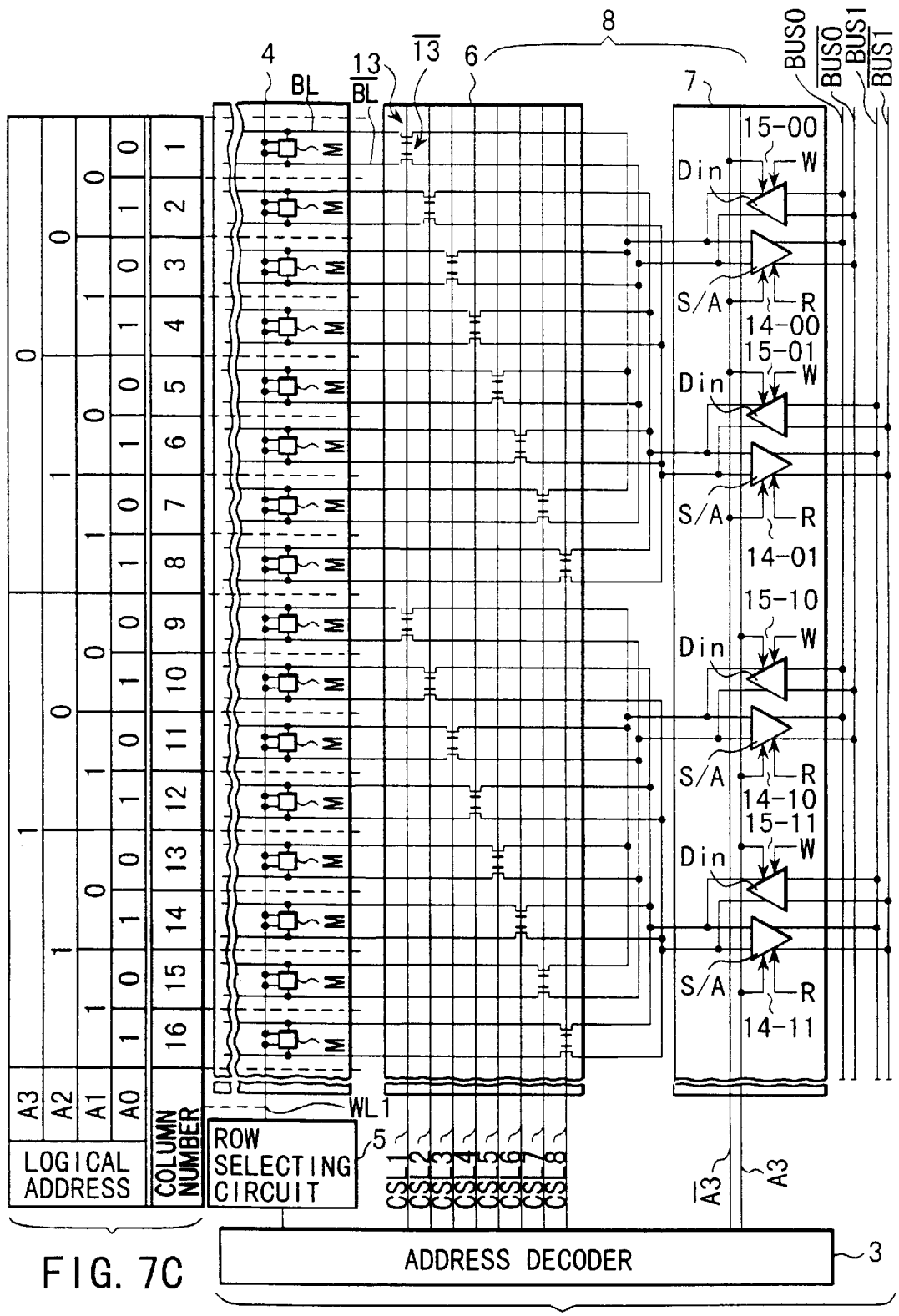
FIG. 7A is a circuit diagram showing one circuit arrangement of an SRAM core.
FIG. 7C is a view showing the relationship between the column numbers and logical addresses of memory cells.

The address decoder 3 decodes the address signal bits A0 to A17 to generate a signal for selecting a row of a memory cell array 4 and a signal for selecting a column of the memory cell array 4. The signal for selecting a row is supplied to a row selecting circuit 5. The signal for selecting a column is supplied to a column selecting circuit 6 and a sense amplifier & writing circuit 7. The column selecting circuit 6 and the sense amplifier & writing circuit 7 constitute a data transfer circuit 8 for connecting a memory cell of the memory cell array 4 to data lines BUS0 and BUS1. FIG. 7A is a circuit diagram of an SRAM core.

Figure 7B:
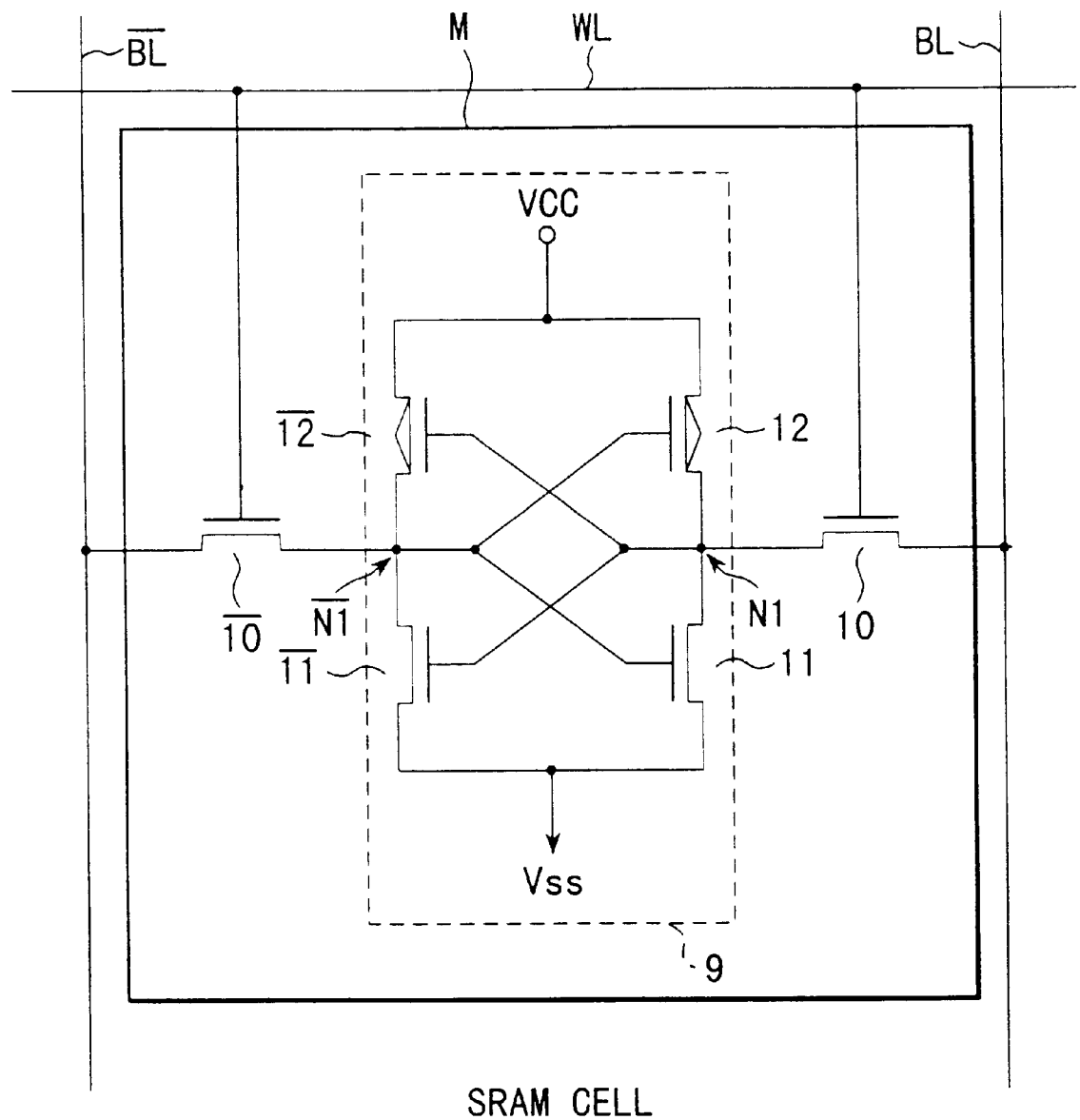
FIG. 7B is a circuit diagram showing one circuit arrangement of a static memory cell.

As shown in FIG. 7A, the row selecting circuit 5 selects a word line WL in accordance with the row selecting signal output from the address decoder 3, and drives the selected word line WL. The word line WL extends to the memory cell array 4 and is connected to a static memory cell M in the memory cell array 4. FIG. 7B is a circuit diagram of the static memory cell M.

As shown in FIG. 7B, the static memory cell M is composed of a latch circuit 9 for storing data, an N-channel MOS transistor 10 connected in series between a positive-phase node N1 of the latch circuit 9 and a bit line BL, and an N-channel MOS transistor /10 connected in series between a negative-phase node /N1 of the latch circuit 9 and a bit line /BL. The word line WL is connected to the gates of the transistors 10 and /10. When the potential of the word line WL is set at "H" level, both the transistors 10 and /10 are turned on, and the bit line BL and the positive-phase node N1 are electrically connected to each other. At the same time, the bit line /BL and the negative-phase node /N1 are electrically connected to each other. As a result, the latch circuit 9 and the bit lines BL and /BL are electrically connected to each other. For example, the latch circuit 9 is a cross-coupled CMOS latch circuit made up of a pair of N-channel MOS transistors 11 and /11 for sense driving and a pair of P-channel MOS transistors 12 and /12 as loads.

Such static memory cells M are arranged in the form of a matrix in correspondence with the electrical intersections of the word lines WL and pairs of bit lines BL and /BL.

In the device according to this embodiment, the static memory cells M forming a matrix are classified into a first memory cell group connected to the data line BUS0 and a second memory cell group connected to the data line BUS1 on the basis of the addresses. FIG. 7C shows the relationship between the column numbers and logical addresses of memory cells.

FIG. 7C shows the address bits A0 to A3 which are the four lower bits of the 18 address bits A0 to A17. There are 16 combinations (the fourth power of 2) of the four logical address bits A0 to A3. Four logical addresses can therefore select one of 16 memory cells. For the sake of convenience, column numbers 1 to 16 are assigned to the 16 memory cells.

As shown in FIGS. 7A and 7C, in the device according to the first embodiment, memory cells with odd numbers of column numbers 1 to 16 are connected to the data line BUS0, whereas memory cells with even numbers of column numbers 1 to 16 are connected to data line BUS1. Whether a given column number is an even or odd number is determined by the logic of the least significant bit A0 of the address bits A0 to A17, as shown in FIG. 7C. More specifically, if the least significant bit A0 of the address bits A0 to A17 input to the address decoder 3 is "0", the corresponding memory cell is connected to the data line BUS0. If this bit A0 is "1", the memory cell is connected to the data line BUS1.

The pair of bit lines BL and /BL are connected to the column selecting circuit 6. The column selecting circuit 6 selects the pair of bit lines BL and /BL in accordance with signals CSL1 to CSL8, and connects the selected pair of bit lines BL and /BL to the sense amplifier & writing circuit 7. The signals CSL1 to CSL8 can be obtained by decoding the addresses bits A0 to A2.

The column selecting circuit 6 has pairs of N-channel MOS transistors 13 and /13 for the respective pairs of bit lines BL and /BL. The signals CSL1 to CSL8 are supplied to the gates of the pair of N-channel MOS transistors 13 and /13.

The sense amplifier & writing circuit 7 has sense amplifiers 14-00, 14-01, 14-10, and 14-11 and writing circuits 15-00, 15-01, 15-10, and 15-11. In the read mode, when the address bit A3 is "0", the sense amplifiers 14-00 and 14-01 are activated to amplify and transfer data to the data lines BUS0 and BUS1. In addition, in the read mode, when the address bit A3 is "1", the sense amplifiers 14-10 and 14-11 are activated to amplify and transfer data to the data lines BUS0 and BUS1.

In the write mode, when the address bit A3 is "0", the writing circuits 15-00 and 15-01 are activated to amplify and transfer data from the data lines BUS0 and BUS1 to the column selection circuit 6. In addition, in the write mode, when the address bit A3 is "1", the writing circuits 15-00 and 15-01 are activated to amplify and transfer data from the data lines BUS0 and BUS1 to the column selection circuit 6.

In the burst operation scheme, in particular, the rule for changing burst addresses changes depending on whether the linear mode or interleaved mode is set.

A burst address counter 16 in FIG. 6 generates a burst address when the burst operation scheme is ordered. The burst address counter 16 is activated when an internal command signal Bo is activated. The signal Bo is a signal for ordering the burst operation scheme. The burst address counter 16 consecutively converts the input address bits A0 to A17 into four burst addresses by regularly changing, for example, the address bits A0 and A1, which are the two lower bits of the address bits A0 to A17 outputted from the address register 1.

In the linear mode, all the memory cells of the memory cell array 4 are activated at once. Referring to FIGS. 7A and 7C, for example, all the memory cells M at column numbers 1 to 16 are simultaneously activated.

In the interleaved mode, all the memory cells M of the memory cell array 4 are not simultaneously activated but alternately activated by, for example, halves. For example, referring to FIGS. 7A and 7C, memory cells M designated when the address A1 is "0" (column numbers 1, 2, 5, 6, 9, 10, 13, and 14) and memory cells M designated when the address A1 is "1" (column numbers 3, 4, 7, 8, 11, 12, 15, and 16) are alternately activated.

[SDR Scheme]
(Burst Operation Scheme/Linear Mode)

The burst address counter 16 changes the address bits A1 and A0, which are the two lower bits of the input address bits A0 to A17, as shown in FIG. 8A. There are four combinations of the two lower bits (A1, A0) of the burst start address, namely (0, 0), (0, 1), (1, 0), and (1, 1), as shown in FIG. 8A. Changes in the address bits A1 and A0 especially in a case wherein the burst start address is (0, 1) will be described.

Assume that the burst start address is (0, 1), and the memory cell M corresponding to column number "2" in FIG. 7C is selected. In this case, the burst address counter 16 changes the address bits A1 and A0 as follows: (0, 1)→(1, 0)→(1, 1)→(0, 0), so as to select the memory cells M corresponding to column numbers "2", "3", "4", and "1" in the order named.

In the linear mode, all the memory cells are active. It therefore suffices if the two lower bits of the burst address, i.e., the address bits A1 and A0, are sequentially incremented.

(Burst Operation Scheme/Interleaved Mode)

The burst address counter 16 changes the address bits A1 and A0, which are the two lower bits of the input address bits A0 to A17, as shown in FIG. 8B.

Changes in the address bits A1 and A0 especially in a case wherein the burst start address is (0, 1) will be described.

Assume that the burst start address is (0, 1), and the memory cell M corresponding to column number "2" in FIG. 7C is selected. In this case, the burst address counter 16 changes the address bits A1 and A0 as follows: (0, 1)→(0, 0)→(1, 1)→(1, 0), so as to select the memory cells M corresponding to column numbers "2 ", "1", "4", and "3" in the order named.

In the interleaved mode, as the address bit A1 is set to "0" and "1", the memory cells M are alternately activated by halves. It therefore suffices if the address bit A0 is alternately changed, and the address bit A1 is changed every time the address bit A0 returns to the logic at the start of operation.

[DDR Scheme]
(Burst Operation Scheme/Linear Mode)

The burst address counter 16 changes the address bits A1 and A0, which are the two lower bits of the input address bits A0 to A17, as shown in FIG. 8C.

Changes in the address bits A1 and A0 especially in a case wherein the burst start address is (0, 1) will be described.

Assume that the burst start address is (0, 1), and the memory cell M corresponding to column number "2" in FIG. 7C is selected. In this case, as in the SDR scheme, the burst address counter 16 changes the address bits A1 and A0 as follows: (0, 1)→(1, 0)→(1, 1)→(0, 0), so as to select the memory cells M corresponding to column numbers "2", "3", "4", and "1" in the order named.

(Burst Operation Scheme/Interleaved Mode)

The burst address counter 16 changes the address bits A1 and A0, which are the two lower bits of the input address bits A0 to A17, as shown in FIG. 8D.

Changes in the address bits A1 and A0 especially in a case wherein the burst start address is (0, 1) will be described.

Assume that the burst start address is (0, 1), and the memory cell M corresponding to column number "2" in FIG. 7C is selected. In this case, the burst address counter 16 changes the address bits A1 and A0 as follows: (0, 1)→(0, 0)→(1, 1)→(1, 0), so as to select the memory cells M corresponding to column numbers "2", "1", "4", and "3" in the order named.

In the above six combinations of operations, when the least significant bit A0 is "0", the selected memory cell M is connected to the data line BUS0. When this bit A0 is "1", the selected memory cell M is connected to the data line BUS1. The data lines BUS0 and BUS1 are connected to a data output circuit 17 and a data input circuit 30.

[Data Output Circuit 17]

As shown in FIG. 6, the data input/output circuit 17 is basically made up of a read data line controller 18, read registers (output registers) 19u and 19d, and output transfer gates 20u and 20d.

The data line BUS0 is connected to a first input terminal 21e of the read data line controller 18. The data line BUS1 is connected to a second input terminal 21o of the read data line controller 18.

The read data line controller 18 includes switch circuits 23-0, 23-1, 23-2, and 23-3. The input terminal 21e is connected to one end of each of the switch circuits 23-0 and 23-2. The input terminal 21o is connected to one end of each of the switch circuits 23-1 and 23-3. Each of these switch circuits 23-0 to 23-3 is controlled by a control signal RBC. A first output terminal 24u of the controller 18 is connected to the other end of each of the switch circuits 23-0 and 23-1. A second output terminal 24d of the controller 18 is connected to the end of each of the switch circuits 23-2 and 23-3. The output terminal 24u is connected to the input terminal of a read data line sense amplifier 26u. The output terminal 24d is connected to the input terminal of a read data line sense amplifier 26d.

The sense amplifier 26u is activated in, for example, read operation. The sense amplifier 26u then amplifies the read data output to the output terminal 24u and transfers it to the input terminal of the read register 19u. Similarly, the sense amplifier 26d is activated in, for example, read operation. This amplifier 26d then amplifies the read data output to the output terminal 24d and transfers it to the input terminal of the read register 19d.

The read register 19u stores the read data output through the sense amplifier 26u. The read register 19d stores the read data output through the sense amplifier 26d. The read registers 19u and 19d output the stored data in synchronism with the up-edge of the operation clock CK. The output terminal of the read register 19u is connected to the input terminal of the output transfer gate 20u. The output terminal of the read register 19d is connected to the input terminal of the output transfer gate 20d.

The output transfer gate 20u outputs the read data output from the read register 19u while the operation clock CK stays at "H" level. The output transfer gate 20d outputs the read data output from the read register 19d while an inverted operation clock /CK stays at "H" level. The inverted operation clock /CK is a clock that is opposite in phase to the operation clock CK. The inverted operation clock /CK rises at the same time the operation clock CK falls. With this operation, in this embodiment, data are apparently output in synchronism with both the up-edge and down-edge of the operation clock CK. This allows the device to cope with the DDR scheme.

For example, the operation clock CK and the inverted operation clock /CK are generated by a clock buffer 27 placed in the chip. The clock buffer 27 generates the operation clock CK and the inverted operation clock /CK from an external clock CKext.

The output terminals of the output transfer gates 20u and 20d are connected to the input terminal of an output buffer 28. The output terminal of the output buffer 28 is connected to an input/output terminal 29 of the chip.

[Data Input Circuit 30]

A data input circuit 30 basically includes first-stage write registers (first-stage input registers) 31u and 31d, second-stage write registers (second-stage input registers) 32e and 32o, and a write data line controller 33.

The input/output terminal 29 is connected to the input terminal of an input buffer 34. The output terminal of the input buffer 34 is connected to the input terminals of the first-stage write registers 31u and 31d. The write register 31u outputs the write data stored therein while the operation clock CK stays at "H" level. The write register 31d outputs the write data stored therein while the inverted operation clock /CK stays at "H" level. With this operation, in this embodiment, data are input in synchronism with both the up-edge and down-edge of the operation clock CK. This allows the device to cope with the DDR scheme. The output terminal of the write register 31u is connected to a first input terminal 35u of the write data line controller 33. The output terminal of the write register 31d is connected to a second input terminal 35d of the write data line controller 33.

The write data line controller 33 includes switch circuits 37-0, 37-1, 37-2, and 37-3. The input terminal 35u is connected one end of each of the switch circuits 37-0 and 37-2. The input terminal 35d is connected to one end of each of the switch circuits 37-1 and 37-3. Each of these switch circuits 37-0 to 37-3 is controlled by a control signal WBC. The other end of each of the switch circuits 37-0 and 37-1 is connected to a first output terminal 38e of the controller 33. The other end of each of the switch circuits 37-2 and 37-3 is connected to a second output terminal 38o of the controller 33. The output terminal 38e is connected to the input terminal of the second-stage write register 32e. The output terminal 38o is connected to the input terminal of the second-stage write register 32o.

The second-stage write register 32e stores the write data output to the output terminal 38e. The second-stage write register 32o stores the write data output to the output terminal 38o. Each of the write registers 32e and 32o outputs the stored write data in synchronism with the up-edge of the operation clock CK. The output terminals of the write registers 32e and 32o are respectively connected to the input terminals of write data line buffers 40e and 40o.

The write data line buffer 40e is activated in, for example, write operation. The write data line buffer 40e buffers the write data output from the write register 32e, and sends it to the data line BUS0. Similarly, the write data line buffer 40o is activated in, for example, write operation. This buffer 40o buffers the write data output from the write register 32o, and sends it the data line BUS1.

[Control System Circuit]

The data output circuit 17 is activated in read operation. The data input circuit 30 is activated in write operation. Whether read or write operation is performed is determined by a command signal READ/WRITE.

The synchronous SRAM according to the first embodiment can cope with both the SDR scheme and the DDR scheme, and can select either the SDR scheme or the DDR scheme. Whether to select the SDR or DDR scheme is determined by a command signal SINGLE/DOUBLE.

As an address input scheme, the burst scheme can be used as well as the normal scheme. Whether to use the normal or burst scheme is determined by a command signal BURST.

As memory cell array activation schemes, the linear scheme and the interleaved scheme can be used. Whether to select the linear or interleaved scheme is determined by a command signal LINEAR/INTERLEAVE.

These command signals are input to a command decoder 41. The command decoder 41 decodes the command signals to generate a signal Ro/Wo, a signal So/Do, a signal Bo, and a signal Lo/Io. The signal Ro/Wo is used to designate read or write operation, and is supplied to a read/write control circuit 42 and a data line control circuit 43, in particular. The signal So/Do is used to designate the SDR or DDR scheme, and is supplied to the burst address counter 16 and the data line control circuit 43, in particular. The signal Bo is used to designate the normal or burst scheme, and is supplied to the burst address counter 16, in particular. The signal Lo/Io is used to designate the linear or interleaved scheme, and is supplied to the burst address counter 16, in particular.

When the burst scheme is designated by the signal Bo, the burst address counter 16 generates a burst address on the basis of the signals So/Do and Lo/Io, as shown in FIGS. 8A to 8D.

The read/write control circuit 42 generates signals R, R', W, W', and PRC on the basis of the signal Ro/Wo. The signals R and R' are used to activate the sense amplifiers 14-00, 14-01, 14-10, and 14-11 and the read data line sense amplifiers 26u and 26d in read operation. The signals W and W' are used to activate the writing circuits 15-00, 15-01, 15-10, and 15-11 and the write data line buffers 40e and 40o in write operation. The signal PRC is supplied to pre-charge circuits 44-0 and 44-1. The pre-charge circuit 44-0 pre-charges the data line BUS0 to the VCC level in response to the signal PRC. The pre-charge circuit 44-1 pre-charges the data line BUS0 to the VCC level in response to the signal PRC.

The data line control circuit 43 generates the signals RBC and WBC on the basis of the signals Ro/Wo, So/Do, and the least significant bit A0.

The signal RBC controls the read data line controller 18. The signal RBC, in particular, ON/OFF-controls the switch circuits 23-0 to 23-3 at a timing different from the timing at which the read registers 19u and 19d are driven.

The signal WBC controls the write data line controller 33. The signal WBC, in particular, ON/OFF-controls the switch circuits 37-0 to 37-3 at a timing different from the timing at which the second-stage write registers 32e and 32o are driven.

The operation of the synchronous SRAM according to the first embodiment will be described below by taking the linear and burst schemes as examples.

[DDR Read]

Figure 9:
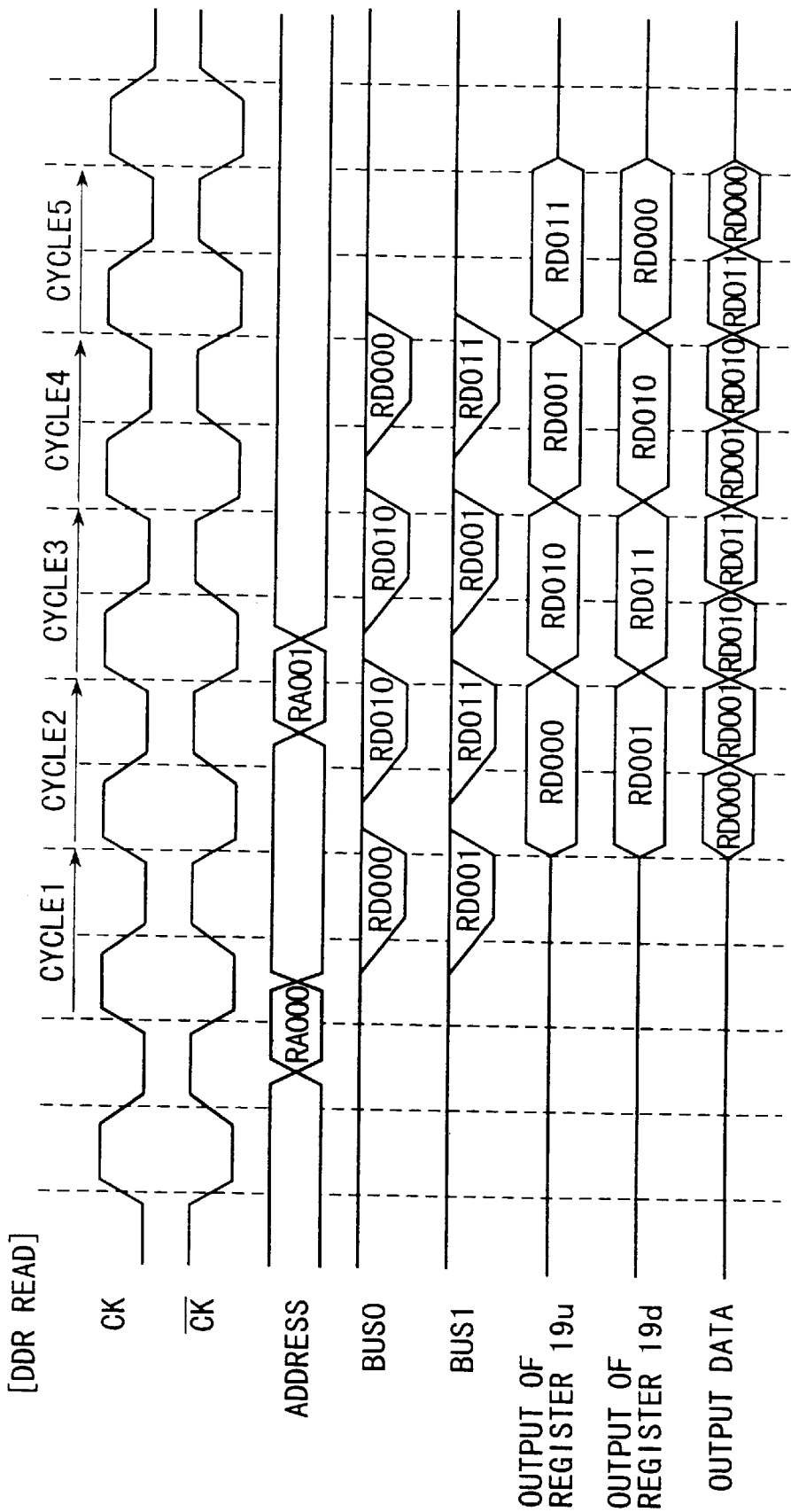
FIG. 9 is a timing chart showing the DDR read operation of a synchronous DRAM according to the first embodiment of the present invention.

FIG. 9 is a timing chart showing a DDR read.

As shown in FIG. 9, in cycle 1, address RA000 ("000" respectively correspond to the logic levels of the address bits A2, A1, and A0) is input to the chip. The burst address counter 16 uses address RA000 as a start address to change the address bits A1 and A0, as shown in FIG. 8C. With this operation, burst addresses are generated.

In cycle 1, burst addresses RA000 and RA001 (not shown) are generated. Data RD000 is read out from the memory cell designated by burst address RA000 to the data line BUS0. Data RD001 is read out from the memory cell designated by burst address RA001 to the data line BUS1.

The read data line controller 18 refers to the least significant bit A0 of the start address to control the connection relationship between the data lines BUS0 and BUS1 and the read registers 19u and 19d. FIG. 10A shows the state of the read data line controller 18 when the least significant bit A0 is "0".

As shown in FIG. 10A, when the least significant bit A0 is "0", the switch circuit 23-0 is turned on, the switch circuit 23-1 is turned off, the switch circuit 23-2 is turned off, and the switch circuit 23-3 is turned on. In this state, the data line BUS0 is connected to the read register 19u, and the data line BUS1 is connected to the read register 19d. As a result, data RD000 read out to the data line BUS0 is stored in the read register 19u, and data RD001 read out to the data line BUS1 is stored in the read register 19d. In cycle 2, burst addresses RA010 and RA011 (not shown) are generated. Data RD010 is read out from the memory cell designated by burst address RA000 to the data line BUS0. Data RD011 is read out from the memory cell designated by burst address RA011 to the data line BUS1. Data RD010 is stored in the read register 19u, and data RD011 is stored in the read register 19d.

In addition, the read registers 19u and 19d respectively output data RD000 and RD001 stored in cycle 1. With this operation, readout data RD000 is output through the output transfer gate 20u in synchronism with the up-edge of the operation clock CK. Subsequently, readout data RD001 is output through the output transfer gate 20d in synchronism with the up-edge of the inverted operation clock /CK.

In cycle 3, the read registers 19u and 19d respectively output readout data RD010 and RD011 stored in cycle 2. With this operation, readout data RD010 is output through the output transfer gate 20u in synchronism with the up-edge of the operation clock CK. Subsequently, readout data RD011 is output through the output transfer gate 20d in synchronism with the up-edge of the inverted operation clock /CK.

In cycle 3, address RA001 is input to the chip. The least significant bit A0 of address RA001 is "1". The burst address counter 16 changes the address bits A1 and A0 by using address RA001 as a start address, as shown in FIG. 8C.

In cycle 3, burst addresses RA001 and RA010 (not shown) are generated. Data RD001 is read out from the memory cell designated by burst address RA001 to the data line BUS1. Data RA010 is read out from the memory cell designated by burst address RA010 to the data line BUS0. FIG. 10B shows the state of the read data line controller 18 when the least significant bit A0 is "1".

As shown in FIG. 10B, when the least significant bit A0 is "1", the switch circuit 23-0 is turned off, the switch circuit 23-1 is turned on, the switch circuit 23-2 is turned on, and the switch circuit 23-3 is turned off. In this state, the data line BUS0 is connected to the read register 19d. The data line BUS1 is connected to the read register 19u. As a result, data RD010 read out to the data line BUS0 is stored in the read register 19d, and data RD001 read out to data line BUS1 is stored in the read register 19u.

In cycle 4, the read registers 19u and 19d respectively output data RD001 and RD010 stored in cycle 3. Data RD001 is output through the output transfer gate 20u in synchronism with the up-edge of the operation clock CK. Subsequently, data RD010 is output through the output transfer gate 20d in synchronism with the up-edge of the inverted operation clock /CK.

In cycle 4, burst addresses RA011 and RA000 are generated. Data RD011 is output from the memory cell designated by burst address RA011 to the data line BUS1. Data RA000 is output from the memory cell designated by burst address RA000 to the data line BUS0. Data RA000 read out to the data line BUS0 is stored in the read register 19d. Data RA011 read out to the data line BUS1 is stored in the read register 19u.

In cycle 5, the read registers 19u and 19d respectively output readout data RD011 and RD000 stored in cycle 4. With this operation, data RD011 is output through the output transfer gate 20u in synchronism with the up-edge of the operation clock CK. Subsequently, readout data RD000 is output through the output transfer gate 20d in synchronism with the up-edge of the inverted operation clock /CK.

[SDR Read]

Figure 11:
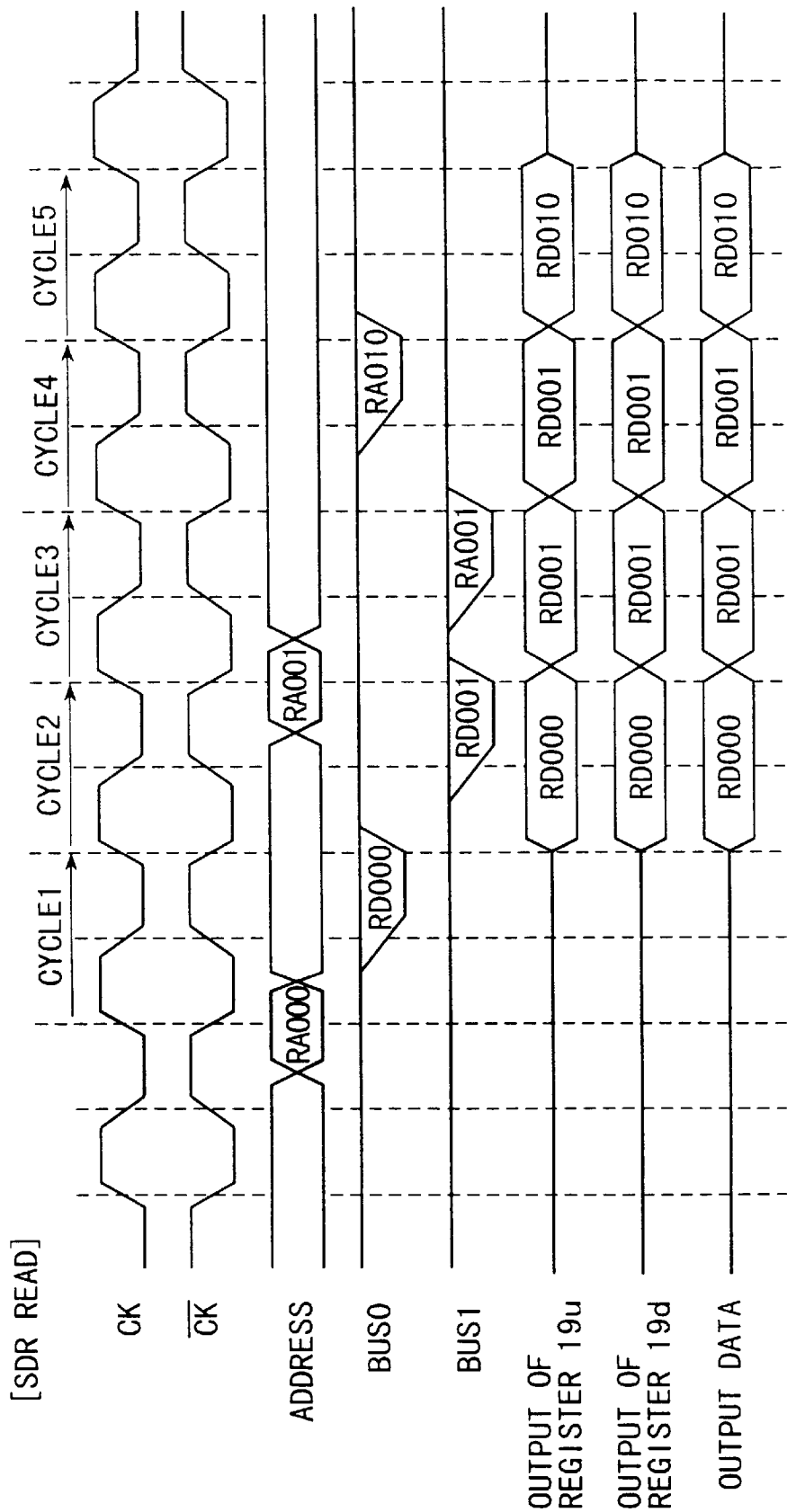
FIG. 11 is a timing chart showing the SDR read operation of the synchronous DRAM according to the first embodiment of the present invention.

FIG. 11 is a timing chart showing an SDR read.

As shown in FIG. 11, address RA000 is input to the chip in cycle 1. The burst address counter 16 changes the address bits A1 and A0 by using address RA000 as a start address, as shown in FIG. 8A.

In cycle 1, burst address RA000 (not shown) is generated. Data RD000 is output from the memory cell designated by burst address RA000 to the data line BUS0. FIG. 12A shows the state of the read data line controller 18 when the least significant bit A0 is "0".

As shown in FIG. 12A, when the least significant bit A0 is "0", the switch circuit 23-0 is turned on, the switch circuit 23-1 is turned off, the switch circuit 23-2 is turned on, and the switch circuit 23-3 is turned off. In this state, the data line BUS0 is connected to at least the read register 19u. As a result, data RD000 read out to the data line BUS0 is stored in at least the read register 19u.

In cycle 2, the read register 19u outputs data RD000 stored in cycle 1. With this operation, readout data RD000 is output through the output transfer gate 20u in synchronism with the up-edge of the operation clock CK.

In cycle 2, burst address RA001 is also generated. Data RD001 is output from the memory cell designated by burst address RA001 to the data line BUS1. FIG. 12B shows the state of the read data line controller 18 when the least significant bit A0 is "1".

As shown in FIG. 12B, when the least significant bit A0 is "1", the switch circuit 23-0 is turned off, the switch circuit 23-1 is turned on, the switch circuit 23-2 is turned off, and the switch circuit 23-3 is turned on. In this state, the data line BUS1 is connected to at least the read register 19u. As a result, data RD001 read out to the data line BUS1 is stored in at least the read register 19u.

In cycle 3, the read register 19u outputs data RD001 stored in cycle 2. With this operation, readout data RD001 is output through the output transfer gate 20u in synchronism with the up-edge of the operation clock CK.

In addition, in cycle 3, address RA001 is input to the chip. The burst address counter 16 changes the address bits A1 and A0 by using address RA001 as a start address, as shown in FIG. 8A.

In cycle 3, burst address RA001 (not shown) is generated. Data RD001 is output from the memory cell designated by burst address RA001 to the data line BUS1. At this time, the least significant bit A0 is "1", and hence the read data line controller 18 is set in the state shown in FIG. 12B. As a result, the data line BUS1 is connected to at least the read register 19u, and data RD001 is stored in at least the read register 19u.

In cycle 4, the read register 19u outputs data RD001 stored in cycle 3. With this operation, readout data RD001 is output through the output transfer gate 20u in synchronism with the up-edge of the operation clock CK.

In cycle 4, burst address RA010 (not shown) is generated. Data RD010 is output from the memory cell designated by burst address RA010 to the data line BUS0. At this time, since the least significant bit A0 is "0", the read data line controller 18 is set in the state shown in FIG. 12A. As a result, the data line BUS0 is connected to at least the read register 19u, and data RD010 is stored in at least the read register 19u.

In cycle 5, the read register 19u outputs data RD010 stored in cycle 4. With this operation, readout data RD010 is output through the output transfer gate 20u in synchronism with the up-edge of the operation clock CK.

As described above, the first embodiment includes the read data line controller 18 that can switch the connection states between the data lines BUS0 and BUS1 and the read registers 19u and 19d depending on whether the DDR or SDR scheme is selected and the least significant bit A0 is "0" or "1". With this arrangement, data can be read out in the order that addresses are generated, in either of the DDR and SDR schemes. If, for example, burst addresses are generated in the order of RA001, RA010, RA011, and RA000 in the DDR scheme, data can be output in the order of RD001, RD010, RD011, and RD000.

In addition, the output transfer gates 20u and 20d respectively output data in synchronism with the operation clock CK and the inverted operation clock /CK. As shown in FIGS. 9 and 11, the output timing of the data is not delayed behind the operation clock CK, /CK.

Even if, therefore, the frequency of the operation clock CK is raised in order to improve the operation speed, it is possible to obtained an adequate data output time.

[DDR Write]

Figure 13:
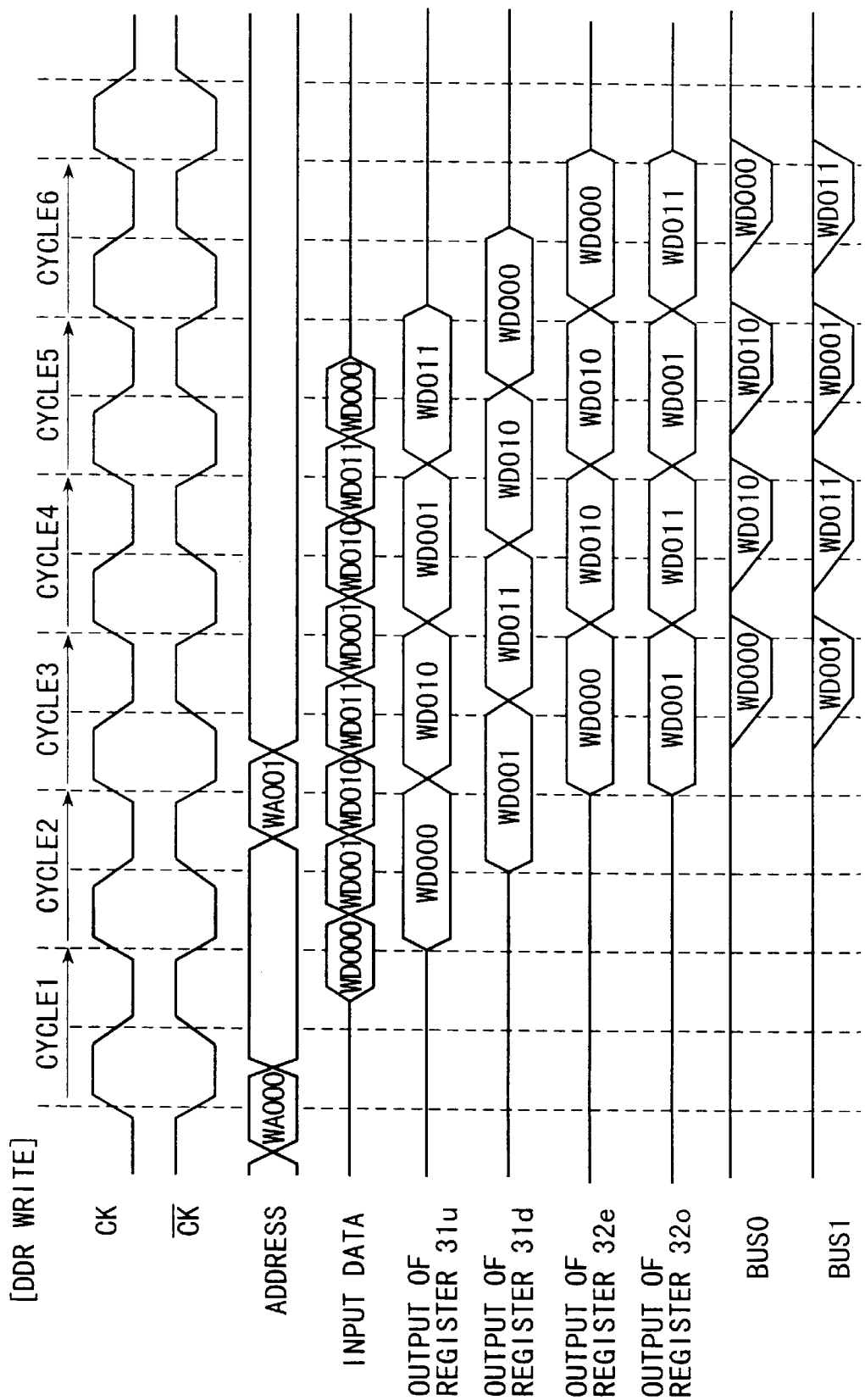
FIG. 13 is a timing chart showing the DDR write operation of the synchronous DRAM according to the first embodiment of the present invention.

FIG. 13 is a timing chart showing a DDR write.

As shown in FIG. 13, address WA000 is input to the chip in cycle 1. The burst address counter 16 changes the address bits A1 and A0 by using address WA000 as a start address, as shown in FIG. 8C. In cycle 1, burst addresses WA000 and WA001(not shown) are generated.

In cycle 2, the first-stage write register 31u outputs data WD000 in synchronism with the up-edge of the operation clock CK. The first-stage write register 31d outputs data WD001 in synchronism with the up-edge of the inverted operation clock /CK.

Figure 14A:
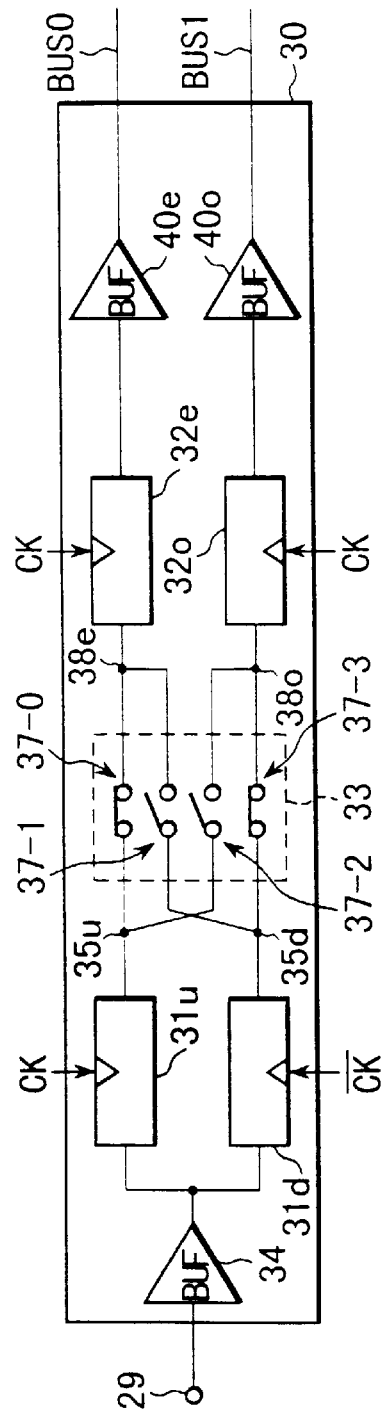
FIGS. 14A and 14B are circuit diagrams each showing the operation of a write data line control circuit (in the DDR scheme)

The write data line controller 33 refers to, for example, the least significant bit A0 of the start address to control the connection relationship between the first-stage write registers 31u and 31d and the second-stage write registers 32e and 32o. FIG. 14A shows the state of the write data line controller 33 when the least significant bit A0 is "0".

As shown in FIG. 14A, when the least significant bit A0 is "0", the switch circuit 37-0 is turned on, the switch circuit 37-1 is turned off, the switch circuit 37-2 is turned off, and the switch circuit 37-3 is turned on. In this state, the write register 31u is connected to the write register 32e, and the write register 31d is connected to the write register 32o. Therefore, data WD000 output from the write register 31u is stored in the write register 32e, and data WD001 output from the write register 31d is stored in the write register 32e.

In cycle 2, burst addresses WA010 and WA011 (not shown) are generated.

In cycle 3, the write registers 32e and 32o respectively output data WD000 and WD001 stored in cycle 2 to the data lines BUS0 and BUS1. Data WD000 is written in the memory cell corresponding to address WA000. Data WD001 is written in the memory cell corresponding to address WA001.

In cycle 3, the first-stage write register 31u outputs data WD010 in synchronism with the up-edge of the operation clock CK. The first-stage write register 31d outputs data WD011 in synchronism with the up-edge of the inverted operation clock /CK. Data WD010 output from the write register 31u is stored in the write register 32e. Data WD011 output from the write register 31d is stored in the write register 32o.

In cycle 3, address WA001 is input to the chip. The burst address counter 16 changes the address bits A1 and A0 by using address WA001 as a start address, as shown in FIG. 8C.

In cycle 3, burst addresses WA001 and WA010 (not shown) are generated.

In cycle 4, the write registers 32e and 32o respectively output data WD010 and WD011 stored in cycle 3 to the data lines BUS0 and BUS1. Data WD010 is written in the memory cell corresponding to address WA010. Data WD011 is written in the memory cell corresponding to address WA011.

Figure 14B:
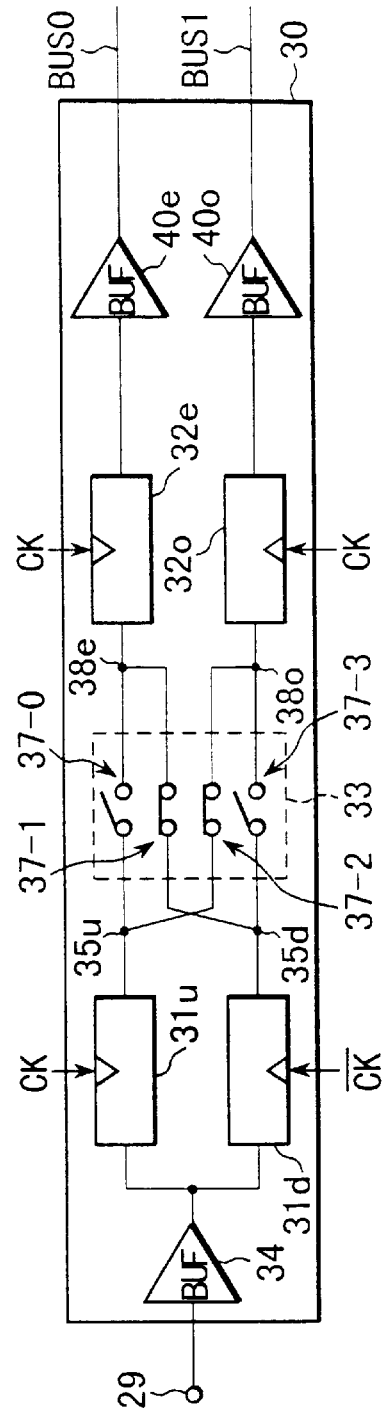

In cycle 4, the first-stage write register 31u outputs data WD001 in synchronism with the up-edge of the operation clock CK. The first-stage write register 31d outputs data WD010 in synchronism with the up-edge of the inverted operation clock /CK. FIG. 14B shows the state of the write data line controller 33 when the least significant bit A0 is "1".

As shown in FIG. 14B, when the least significant bit A0 is "1", the switch circuit 37-0 is turned off, the switch circuit 37-1 is turned on, the switch circuit 37-2 is turned on, and the switch circuit 37-3 is turned off. In this state, the write register 31u is connected to the write register 32o, and the write register 31d is connected to the write register 32e. Data WD001 output from the write register 31u is stored in the write register 32o. Data WD010 output from the write register 31d is stored in the write register 32e.

In cycle 4, burst addresses WA011 and WA000 (not shown) are generated.

In cycle 5, the write registers 32e and 32o respectively output data WD010 and WD001 stored in cycle 4 to the data lines BUS0 and BUS1. Data WD010 is written in the memory cell corresponding to address WA010. Data WD001 is written in the memory cell corresponding to address WA001.

In cycle 5, the first-stage write register 31u outputs data WD011 in synchronism with the up-edge of the operation clock CK, and the first-stage write register 31d outputs data WD000 in synchronism with the up-edge of the inverted operation clock /CK. Data WD011 output from the write register 31u is stored in the write register 32o. Data WD000 output from write register 31d is stored in the write register 32e.

In cycle 6, the write registers 32e and 32o respectively output data WD000 and WD011 stored in cycle 5 to the data lines BUS0 and BUS1. Data WD000 is written in the memory cell corresponding to address WA000. Data WD011 is written in the memory cell corresponding to address WA011.

[SDR Write]

Figure 15:
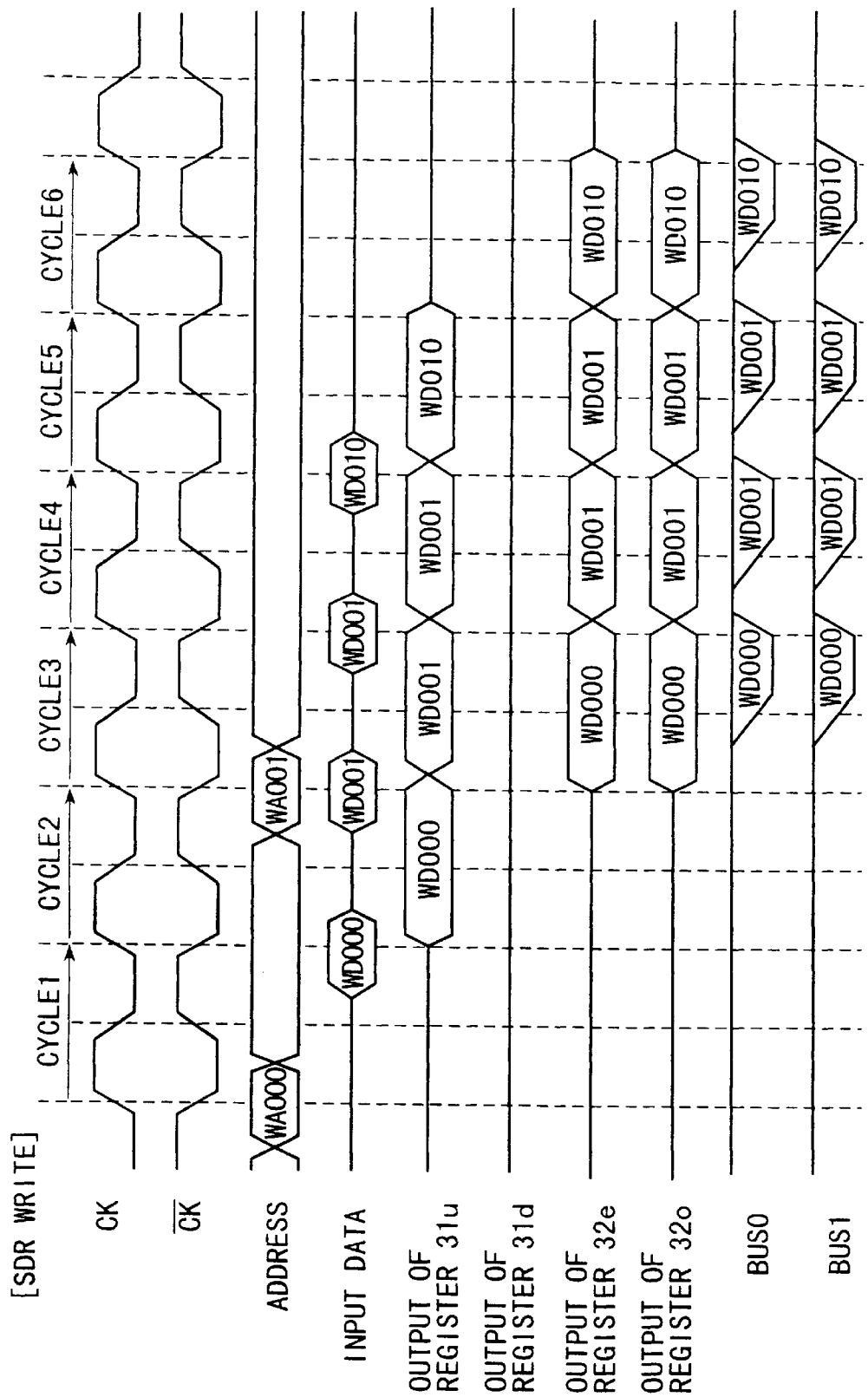
FIG. 15 is a timing chart showing the SDR write operation of the synchronous DRAM according to the first embodiment of the present invention.

FIG. 15 is a timing chart showing an SDR write.

As shown in FIG. 15, address WA000 is input to the chip in cycle 1. The burst address counter 16 changes the address bits A1 and A0 by using address WA000 as a start address, as shown in FIG. 8A. In cycle 1, burst address WA000 (not shown) is generated.

In cycle 2, the first-stage write register 31u outputs data WD000 in synchronism with the up-edge of the operation clock CK.

Figure 16:
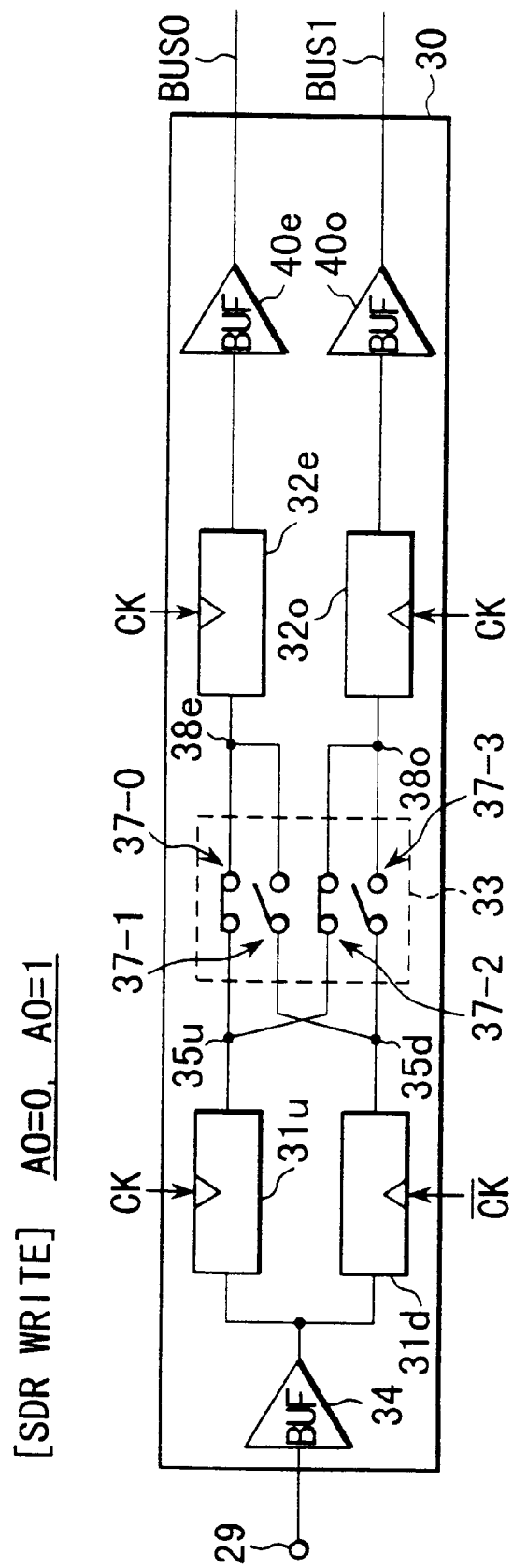
FIG. 16 is a circuit diagram showing the operation of the write data line control circuit (in the SDR scheme)

The write data line controller 33 connects the first-stage write register 31u to the second-stage write registers 32e and 32o regardless of the least significant bit A0. FIG. 16 shows the state of the write data line controller 33 in an SDR write.

As shown in FIG. 16, the switch circuit 37-0 is turned on, the switch circuit 37-1 is turned off, the switch circuit 37-2 is turned on, and the switch circuit 37-3 is turned off. Hence, data WD000 output from the write register 31u is stored in the write registers 32e and 32o.

In cycle 2, burst address WA001(not shown) is generated.

In cycle 3, the write registers 32e and 32o respectively output data WD000 stored in cycle 2 to the data lines BUS0 and BUS1. Data WD000 is then written in the memory cell corresponding to address WA000.

In cycle 3, the first-stage write register 31u outputs data WD001 in synchronism with the up-edge of the operation clock CK. Data WD001 output from the write register 31u is stored in the write registers 32e and 32o.

In cycle 3, address WA001 is input to the chip. The burst address counter 16 changes the address bits A1 and A0 by using address WA001 as a start address, as shown in FIG. 8C. In cycle 3, burst address WA001 (not shown) is generated.

In cycle 4, the write registers 32e and 32o respectively output data WD001 stored in cycle 3 to the data lines BUS0 and BUS1. Data WD001 is then written in the memory cell corresponding to address WA001.

In cycle 4, the first-stage write register 31u outputs data WD001 in synchronism with the up-edge of the operation clock CK. Data WD001 output from the write register 31u is stored in the write registers 32e and 32o.

In cycle 4, burst address WA010 (not shown) is generated.

In cycle 5, the write registers 32e and 32o output data WD001 stored in cycle 4 to the data lines BUS0 and BUS1. Data WD001 is written in the memory cell corresponding to address WA001.

In cycle 5, the first-stage write register 31u outputs data WD010 in synchronism with the up-edge of the operation clock CK. Data WD010 output from the write register 31u is stored in the second-stage write registers 32e and 32o.

In cycle 6, the second-stage write registers 32e and 32o output data WD010 stored in cycle 5 to the data lines BUS0 and BUS1. Data WD010 is then written in the memory cell corresponding to address WA010.

As described above, the first embodiment includes the write data line controller 33 that can switch the connection states between the write registers 31u and 31d and the write registers 32e and 32o depending on whether the DDR or SDR scheme is selected and the least significant bit A0 is "0" or "1". With this arrangement, data can be written while the order that data is input is made to correspond to the order that addresses are generated, in either of the DDR and SDR schemes.

In addition, the write registers 31u and 31d respectively output data in synchronism with the operation clock CK and the inverted operation clock /CK. Unlike in the prior art, therefore, the data output time of each write registers 31u and 31d are not shortened.

Even if, therefore, the frequency of the operation clock CK is raised in order to improve the operation speed, it is possible to adequately obtain the data output times of the write registers 31u and 31d.

[Read Data Line Controller]

Figure 17:
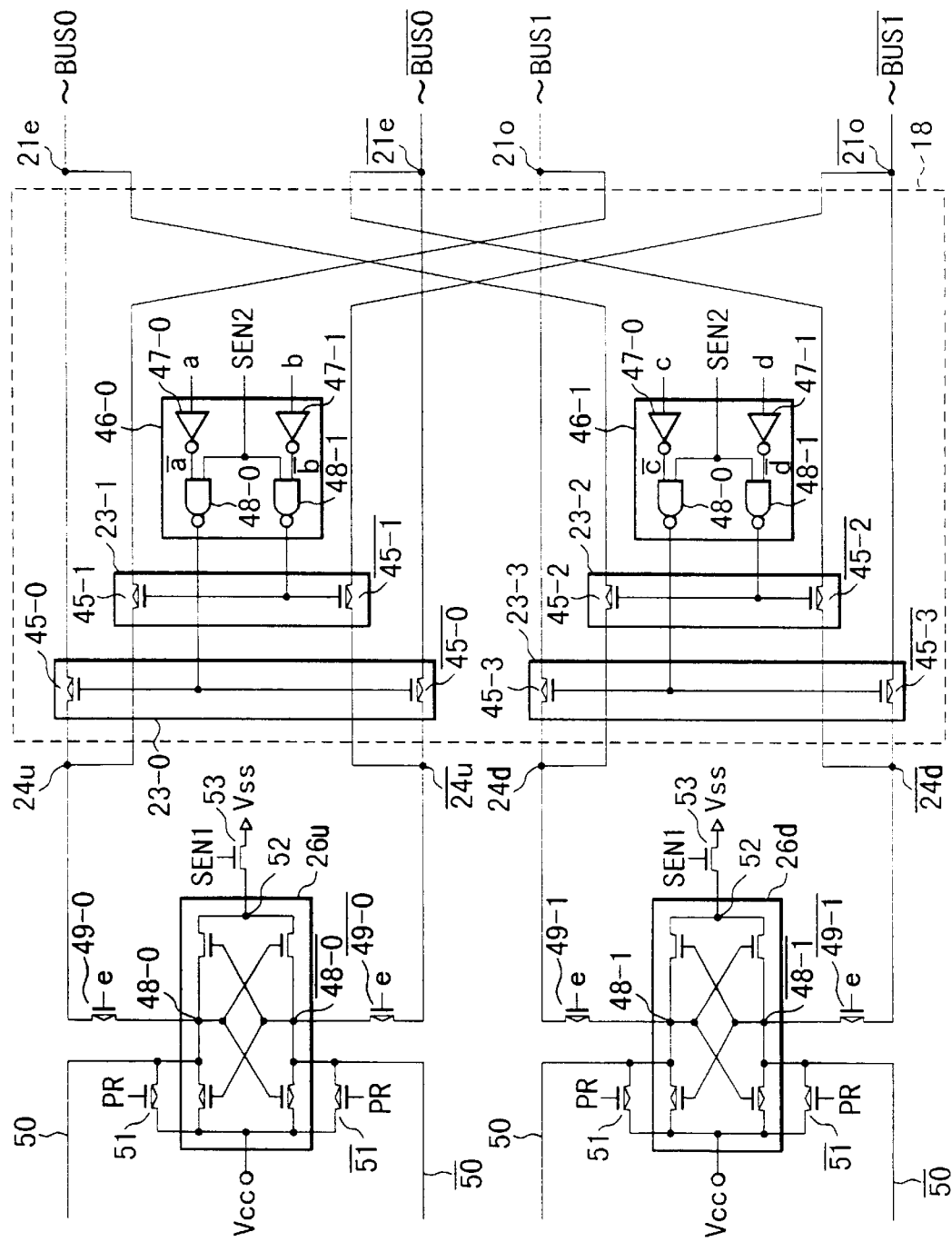
FIG. 17 is a circuit diagram showing one circuit arrangement of the read data line control circuit.

FIG. 17 is a circuit diagram showing a circuit arrangement of the read data line controller 18.

As shown in FIG. 17, the data line BUS0 is composed of a complementary pair of data lines BUS0 and /BUS0, and the data line BUS1 is composed of a complementary pair of data lines BUS1 and /BUS1. The pair of data lines BUS0 and /BUS0 are respectively connected to the first input terminals 21e and /21e of the read data line controller 18. The pair of data lines BUS1 and /BUS1 are respectively connected to the second input terminals 21o and /21o of the read data line controller 18.

The switch circuits 23-0 to 23-3 are respectively made up of transfer gates including pairs of P-channel MOS transistors 45-0 to 45-3 and /45-0 to /45-3.

A switch control circuit 46-0 controls the ON/OFF states of transistors 45-0, /45-0, 45-1, and /45-1.

A switch control circuit 46-1 controls the ON/OFF states of transistors 45-2, /45-2, 45-3, and /45-3.

The switch control circuit 46-0 includes first and second inverter circuits 47-0 and 47-1 and first and second NAND circuits 48-0 and 48-1. A signal a is supplied to the first inverter circuit 47-0. The signal a is set at "L" level to turn on the pair of transistors 45-0 and /45-0. A signal b is supplied to the second inverter circuit 47-1. The signal b is set at "L" level to turn on the pair of transistors 45-1 and /45-1.

An inverted signal /a and an enable signal SEN2 are supplied to the first NAND circuit 48-0. When both the inverted signal /a and the enable signal SEN2 are at "H" level, the first NAND circuit 47-0 turns on the transistors 45-0 and /45-0.

An inverted signal /b and the enable signal SEN2 are supplied to the second NAND circuit 48-1. When both the inverted signal /b and the enable signal SEN2 are at "H" level, the second NAND circuit 48-1 turns on the transistors 45-1 and /45-1.

The switch control circuit 46-1 is identical to the switch control circuit 46-0. When, therefore, a signal c is at "L" level and the enable signal SEN2 is at "H" level, the switch control circuit 46-1 turns on the transistors 45-2 and /45-2. When a signal d is at "L" level and the enable signal SEN2 is at "H" level, the switch control circuit 46-1 turns on the transistors 45-3 and /45-3.

Note that the signals a to d correspond to the signal RBC.

The write data line controller 33 can be formed from a circuit similar to the read data line controller 18 in FIG. 17.

[Read Data Line Sense Amplifier]

FIG. 17 shows the read data line sense amplifiers 26u and 26d. Each of the read data line sense amplifiers 26u and 26d includes a CMOS latch circuit.

Positive- and negative-phase nodes 48-0 and /48-0 o of the sense amplifier 26u are respectively connected to the output terminals 24u and /24u of the read data line controller 18 through a pair of transfer gates 49-0 and /49-0. Each of the transfer gates 49-0 and /49-0 is formed from a P-channel MOS transistor. A signal e is supplied to the gate of this transistor. For example, the signal e corresponds to a signal R'. While the signal e stays at "L" level, the sense amplifier 26u is connected to the output terminals 24u and /24u. The nodes 48-0 and /48-0 are connected to the input terminal of the read register 19u trough interconnections 50 and /50. The nodes 48-0 and /48-0 are connected to a terminal of a power supply potential Vcc through a pair of P-channel MOS transistors 51 and /51. While a pre-charge signal PR stays at "L" level, the pair of transistors 51 and /51 pre-charge the nodes 48-0 and /48-0 to the power supply potential Vcc. A ground node 52 of the sense amplifier 26u is connected to a supply terminal for an intra-circuit ground potential Vss through an N-channel MOS transistor 53. The transistor 53 applies the potential Vss to the ground node 52 while a sense enable signal SEN1 is "H" level.

The sense amplifier 26d is a circuit identical to the sense amplifier 26u. While the signal SEN1 is at "H" level, therefore, the sense amplifier 26d stays activated. While the signal PR is at "L" level, the positive- and negative-phase nodes 48-1 and /48-1 are pre-charged to the power supply potential Vcc. While the signal e is at "L" level, the nodes 48-1 and /48-1 are respectively connected to the output terminals 24d and /24d of the read data line controller 18 through transfer gates 49-1 and /49-1.

The operation of the read data line sense amplifier 26u will be described next.

In read operation, the signal e is set at "L" level, and the data output to the output terminals 24u and /24u are transferred to the nodes 48-0 and /48-0 of the read data line sense amplifier 26u.

After the data are transferred to the nodes 48-0 and /48-0, the signal e is set at "H" level to disconnect the nodes 48-0 and /48-0 from the output terminals 24u and /24u.

Before or when the signal e is set at "H" level, the signal SEN1 is set at "H" level to amplify the transferred data.

This read data line sense amplifier 26u can amplify data while the nodes 48-0 and /48-0 are disconnected from the output terminals 24u and /24u, i.e., the data lines BUS0, /BUS0, BUS1, and /BUS1. For this reason, the capacitances to be connected to the nodes 48-0 and /48-0 can be reduced by the amounts corresponding to the disconnected data lines BUS0, /BUS0, BUS1, and /BUS1.

When the capacitances to be connected to the nodes 48-0 and /48-0 are reduced in this manner, the amplifying speeds of the sense amplifiers 26u can be increased.

Note that the operation of the sense amplifier 26d is the same as that of the sense amplifier 26u.

Figure 18:
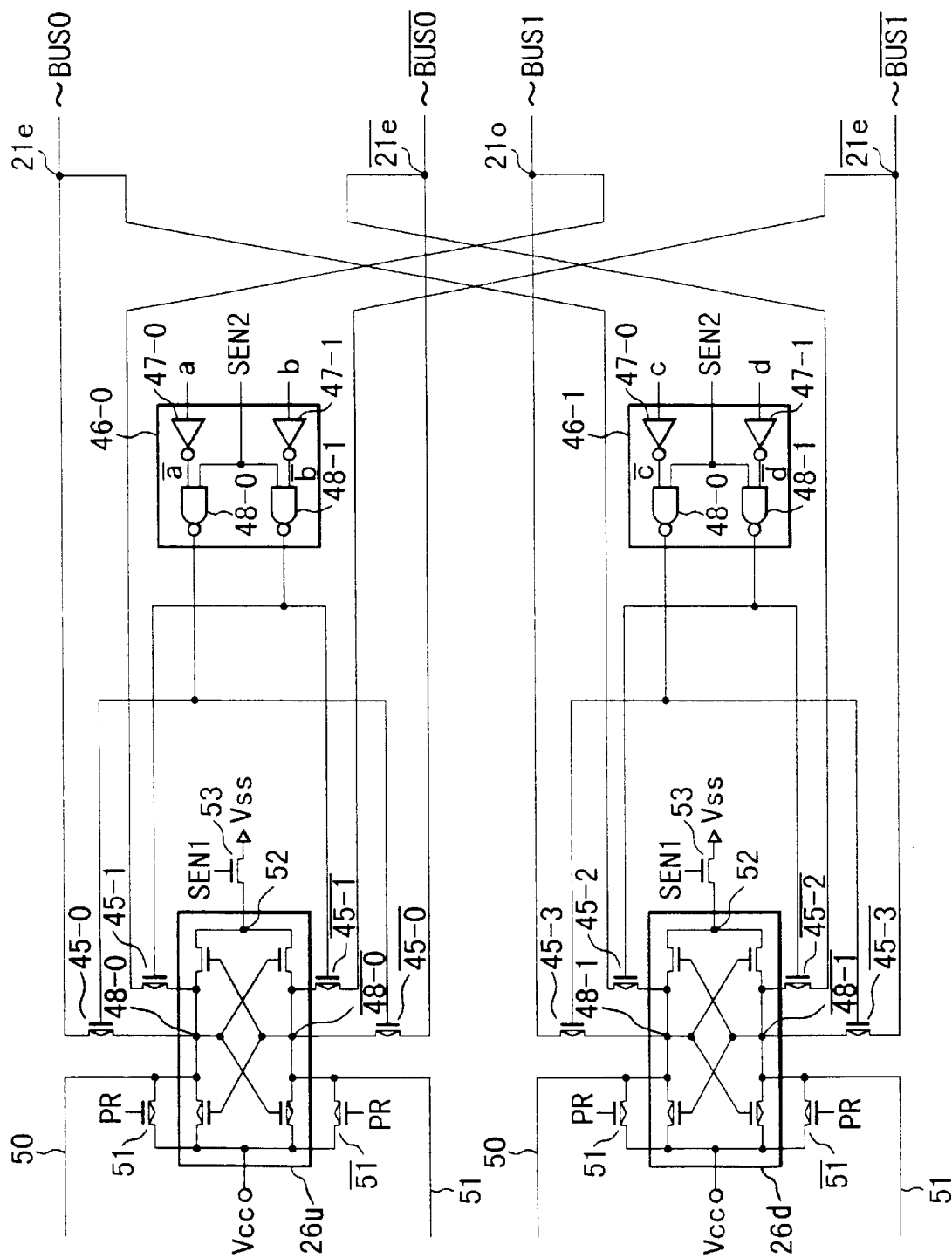
FIG. 18 is a circuit diagram showing another circuit arrangement of the read data line control circuit.

FIG. 18 is a circuit diagram showing another circuit arrangement of the read data line controller 18. The same reference numerals in FIG. 18 denote the same parts as in FIG. 17.

This circuit differs from the circuit in FIG. 17 in that the pairs of transfer gates 49-0, /49-0, 49-1, and /49-1 are omitted, and the read data line controller 18 is directly connected to the sense amplifiers 26u and 26d.

More specifically, as shown in FIG. 18, the positive-phase node 48-0 is connected to the transistors 45-0 and 45-1, and the negative-phase node /48-0 is connected to the transistors /45-0 and /45-1.

The positive-phase node 48-1 is connected to the transistors 45-2 and 45-3, and a negative-phase node 48-1 is connected to transistors /45-2 and /45-3.

In this circuit, the time required to transfer data from the pair of data lines BUS0, /BUS0, BUS1, and /BUS1 to the sense amplifiers 26u and 26d can be shortened by the amounts corresponding to the delays produced by pairs of transfer gates 49-0, /49-0, 49-1, and /49-1.

A preferred example of the operation of the read data line controller 18 according to this circuit arrangement will be described next. Assume that the least significant bit A0 is "0" in DDR operation. In this case, both the signals b and c are at "H" level, and the pairs of transistors 45-1, /45-1, 45-2, and /45-2 are off.

First of all, the signals a and d are set at "L" level to turn on the pairs of transistors 45-0, /45-0, 45-3, and /45-3. With this operation, data on the pair of data lines BUS0 and /BUS0 are transferred to the nodes 48-0 and /48-0, and data on the pair of data lines BUS1 and /BUS1 are transferred to the nodes 48-1 and /48-1.

After the data are transferred, the signals a and d are set at "H" level to turn off the transistors 45-0, /45-0, 45-3, and /45-3. With this operation, the nodes 48-0 and /48-0 are disconnected from the pair of data lines BUS0 and /BUS0, and the nodes 48-1 and /48-1 are disconnected from the pair of data lines BUS1 and /BUS1.

Before or when the signals a and d are set at "H" level, the signal SEN1 is set at "H" level to amplify the transferred data.

According to this preferred example of operation, the capacitances to be connected to the nodes 48-0, /48-0, 48-1 and /48-1 can be reduced, and hence the amplifying speeds of the sense amplifiers 26u and 26d can be increased.

A circuit shown in FIG. 18 includes more number of transistors connected to nodes 48-0, /48-0, 48-1, /48-1 than that shown in FIG. 17. For example, transistors 45-0, 45-1 and 51 are connected to the node 48-0 in the circuit shown, for example, in FIG. 18 and, in comparison with the circuit shown in FIG. 17, one more transistor 45-1 in particular is provided there. For this reason, the junction capacitance of the transistor 45-1 is added as a parasitic capacitance to the node 48-0. However, the junction capacitance of the transistor 45-1 is small by about 1/1000 in comparison to that of the data line BUS0. Thus, even if more transistors are connected nodes 48-0, /48-0, 48-1, /48-1, it is possible to disregard their influence on the amplification operation speed.

[Second Embodiment]

A synchronous SRAM often uses a late write scheme for write operation. The DDR write in FIG. 13 and the SDR write in FIG. 15 are based on the late write scheme. The late write scheme will be described with reference to FIG. 19A.

Figure 19A:
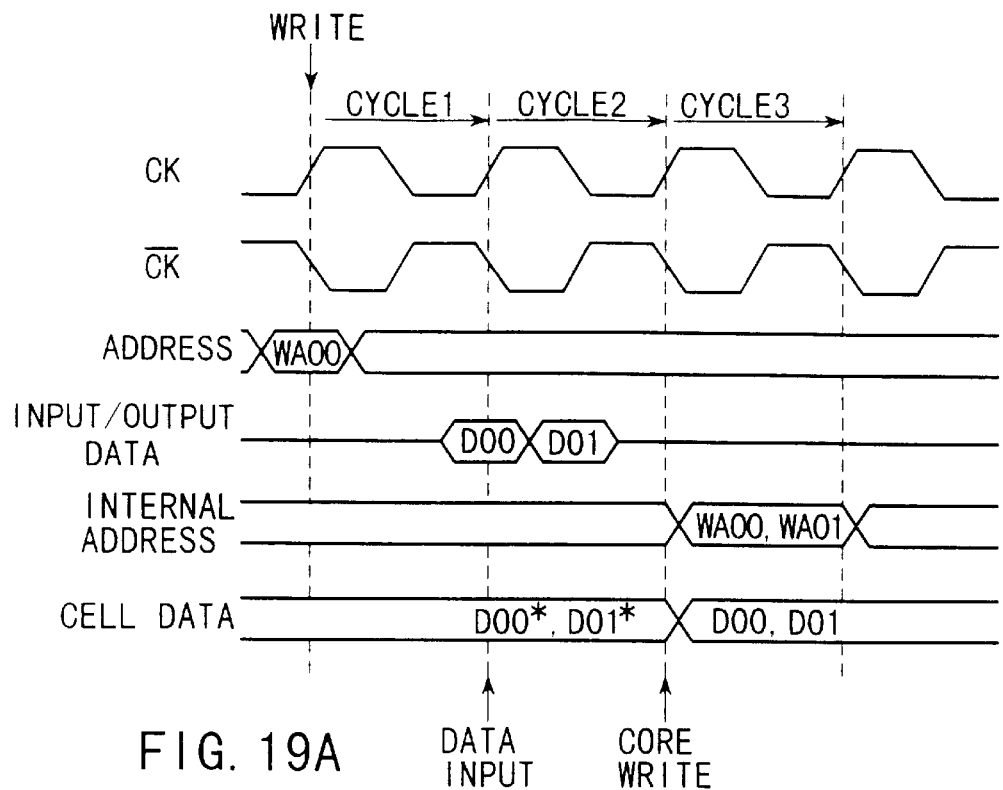
FIGS. 19A and 19B are timing charts each showing a late write scheme.

As shown in FIG. 19A, in the late write scheme, write address WA00 is input to the chip in cycle 1.

In cycle 2, write data D00,D01 is input to the chip (DATA INPUT).

In cycle 3, write data D00,D01 is written in a memory cell of an SRAM core (CORE WRITE).

Note that "WA01" and "WA00" in FIG. 19A are burst addresses generated as start addresses, and "D00*,D01*" indicates data stored in memory cells before data D00,D01 is written.

In a synchronous SRAM using this late write scheme, some measures are preferably taken to maintain data coherency. Data coherency means that when data is read out from the memory cell designated by a read address, the readout data matches the latest write data. A mismatch between the readout data and the latest write data is not desired in terms of data processing. The readout data preferably matches the latest write data. A case wherein readout data does not match latest write data will be described with reference to FIG. 19B.

Figure 19B:
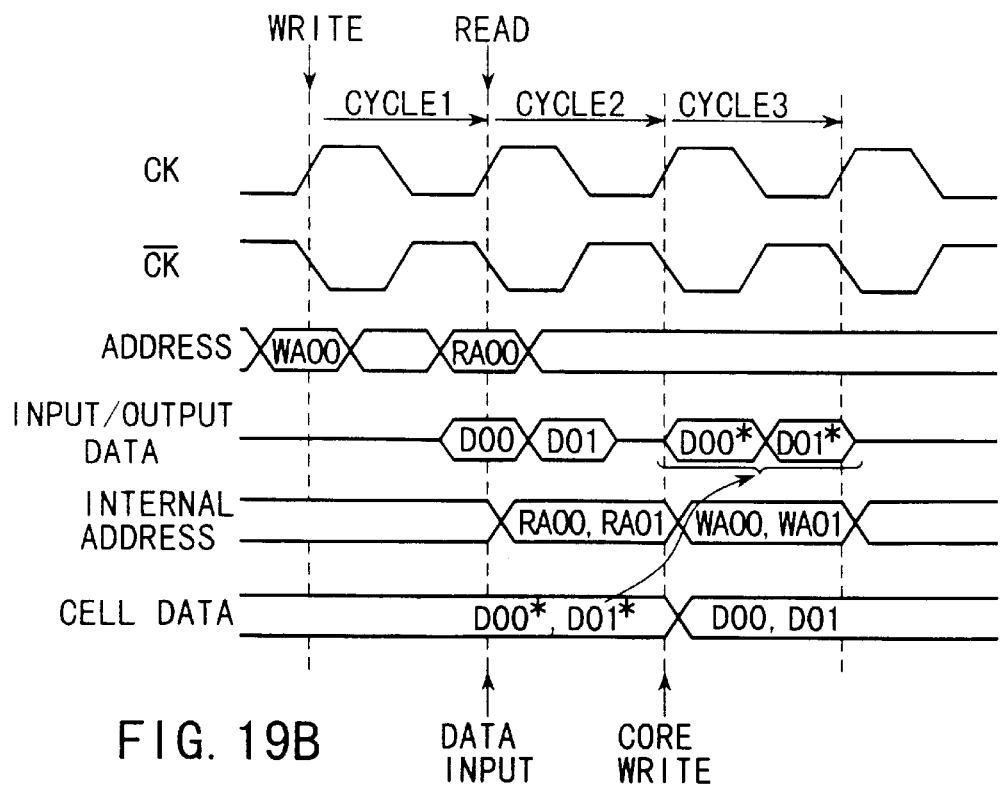

Assume that read address RA00 is input to the chip in cycle 2, as shown in FIG. 19B, and read address RA00 coincides with write address WA00 input in cycle 1. In cycle 2, write data D00,D01 corresponding to write address WA00 has not been written in the memory cell of the SRAM core.

In this case, when data is read out from the memory cell in cycle 2, the readout data becomes data D00*,D01* stored before data D00,D01 is written, and hence does not match latest write data D00,D01.

It is an object of the second embodiment to provide a synchronous semiconductor memory capable of maintaining data coherency.

Figure 20:
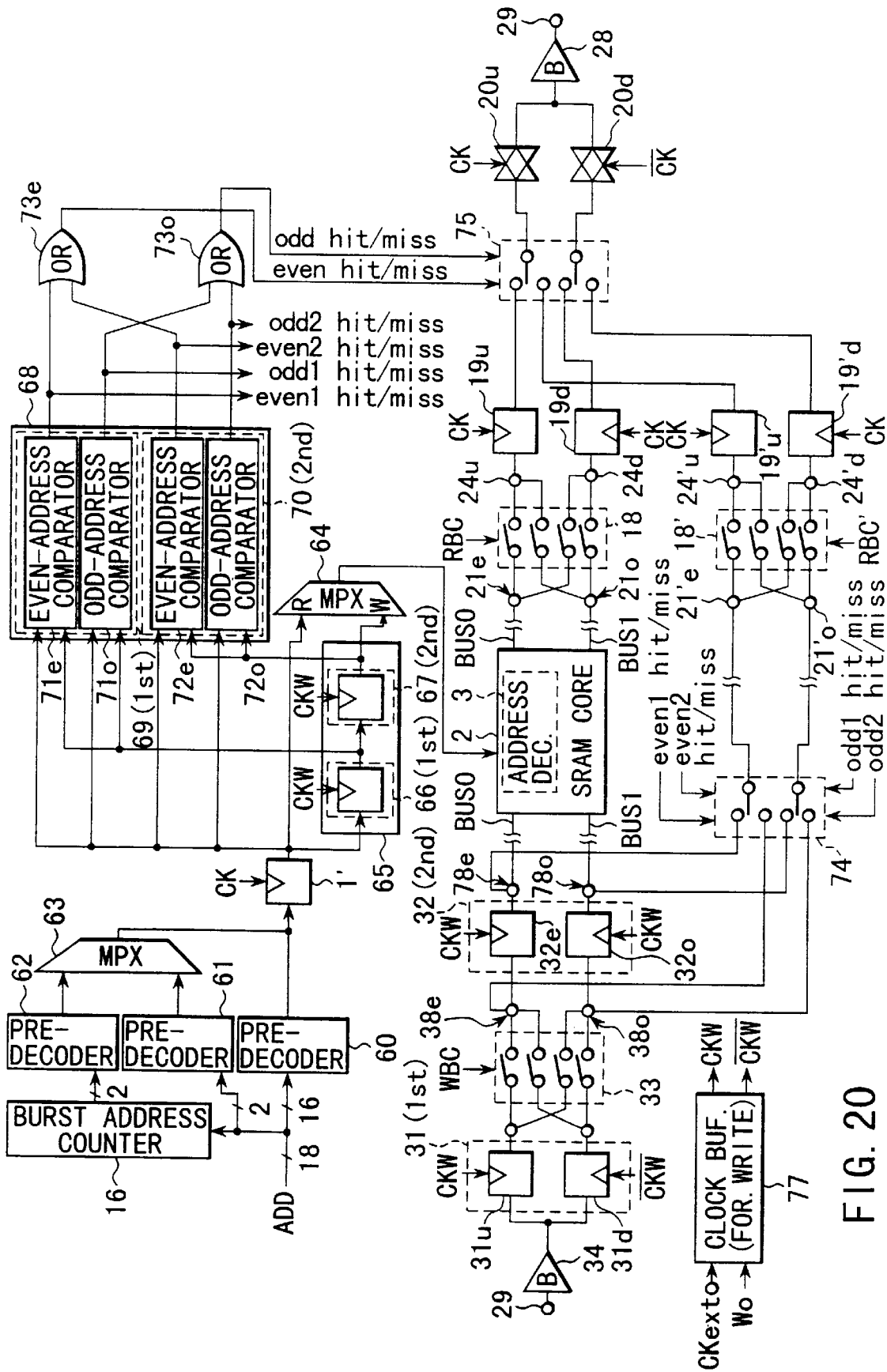
FIG. 20 is a block diagram showing a synchronous SRAM according to the second embodiment of the present invention.

FIG. 20 is a block diagram showing a synchronous SRAM according to the second embodiment of the present invention. The synchronous SRAM in FIG. 20 basically has the same arrangement as that of the synchronous SRAM in FIG. 6. The same reference numerals in FIG. 20 denote the same parts as those of the synchronous SRAM in FIG. 6, and different portions will be mainly described bellow.

As shown in FIG. 20, a pre-decoder 60 pre-decodes the 16 higher bits of an 18-bit address. Of an 18-bit address, for example, nine bits constitute a column address. Two lower bits A1 and A0 of the column address are assigned as burst address bits. The two lower bits A1 and A0 assigned as the burst address bits are input to a burst address counter 16. The burst address counter 16 is identical to the burst address counter 16 shown in FIG. 6.

Figures 21A, 21B:
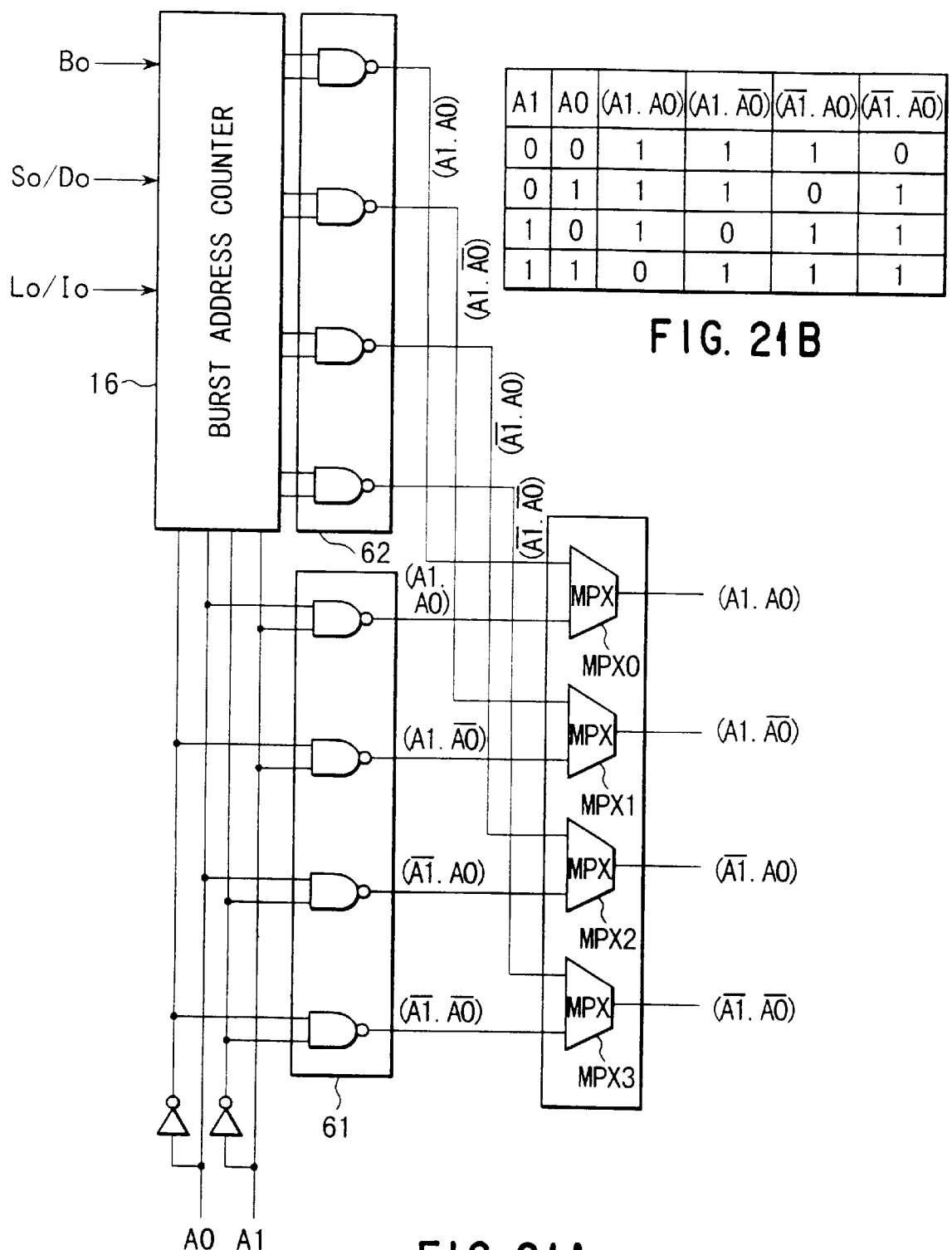
FIG. 21A is a circuit diagram showing one circuit arrangement of the pre-decoders and multiplexer in FIG. 20.
FIG. 21B is a view showing the relationship between the two lower bits A1, A0 and the pre-decoded address bits (A1, A0), (A1, /A0), (/A1, A0), and (/A1, /A0)

The two lower bits A1 and A0 are input to a pre-decoder 61. An output from the burst address counter 16 is input to a pre-decoder 62. Outputs from the pre-decoders 61 and 62 are input to a multiplexer 63. The multiplexer 63 selects one of the outputs from the pre-decoders 61 and 62, and inputs it to an address register 1'. FIG. 21A shows a circuit arrangement of the pre-decoders 61, 62 and the multiplexer 63.

As shown in FIG. 21A, the pre-decoders 61 and 62 respectively output pre-decoded address bits (A1, A0) and (A1, /A0) and (/A1, A0) and (/A1, /A0). FIG. 21B shows the relationship between the two lower bits A1, A0 and the pre-decoded address bits. The multiplexer 63 selects the pre-decoded address bits from the pre-decoder 61 or those from the pre-decoder 62, and inputs them to the address register 1'.

An output from the address register 1' is input to a multiplexer 64 and a write address register 65.

The write address register 65 stores a write address. The write address register 65 includes a first-stage write address register 66 and a second-stage write address register 67. In the write mode, the output from the address register 1' is input to the first-stage write address register 66. An output from the first-stage write address register 66 is input to the second-stage write address register 67. An output from the second-stage write address register 67 is input to the multiplexer 64.

In the read mode, the multiplexer 64 selects the output from the address register 1' and inputs it to an address decoder 3 of the SRAM core 2. In the write mode, the multiplexer 64 selects the output from the write address register 65 and inputs it to the address decoder 3.

When a read address is stored in the address register 1', an address comparison circuit 68 compares the stored read address with the write address stored in the write address register 65. The address comparison circuit 68 includes a first-stage address comparison circuit 69 and a second-stage address comparison circuit 70. The first-stage address comparison circuit 69 detects whether the read address hits the write address stored in the first-stage write address register 66. The second-stage address comparison circuit 70 detects whether the read address hits the write address stored in the second-stage write address register 67.

The first-stage address comparison circuit 69 is made up of an even-numbered address comparison circuit 71e and an odd-numbered address comparison circuit 71o.

The second-stage address comparison circuit 70 is made up of an even-numbered address comparison circuit 72e and an odd-numbered address comparison circuit 72o.

When the least significant A0 is "0", each of the even-numbered address comparison circuits 71e and 72e detects whether all the logic levels of the remaining address bits coincide with each other. The comparison circuit 71e outputs a detection signal even1-hit/miss. The comparison circuit 72e outputs a detection signal even2-hit/miss. Each of the detection signals even1-hit/miss and even2-hit/miss is set at logic level of "H" or "L" depending on whether the address bits coincide with each other. In this embodiment, for the sake of convenience, assume that "H" level indicates coincidence, and "L" level indicates incoincidence.

When the logic level of least significant bit A0 is "1", each of the odd-numbered address comparison circuits 71o and 72o detects whether all the logic levels of the remaining address bits coincide with each other. The comparison circuit 71o outputs a detection signal odd1-hit/miss. The comparison circuit 72o outputs a detection signal odd2-hit/miss. Each of the detection signals odd1-hit/miss and odd2-hit/miss takes logic level "H" or "L" depending on whether the address bits coincide with each other. In this embodiment, for the sake of convenience, assume that "H" level indicates coincidence, and "L" level indicates incoincidence.

The detection signals even1-hit/miss and even2-hit/miss are input to an OR circuit 73e. The detection signals odd1-hit/miss and odd2-hit/miss are input to an OR circuit 73o.

The OR circuit 73e outputs a detection signal even-hit/miss that is set at "H" level when at least one of the signals even1-hit/miss and even2-hit/miss is at "H" level. Similarly, the OR circuit 73o outputs a detection signal odd-hit/miss that is set at "H" level when at least one of the detection signals odd1-hit/miss and odd2-hit/miss is at "H" level.

The signals even1-hit/miss, even2-hit/miss, odd1-hit/miss, and odd2-hit/miss are supplied to a priority function multiplexer 74. The detection signals even-hit/miss and odd-hit/miss are supplied to a multiplexer 75.

The priority function multiplexer 74 connects one of an output terminal 38e of a write data line controller 33 and an output terminal 78e of a second-stage write register 32e to an input terminal 21'e of a second read data line controller 18'. The priority function multiplexer 74 also connects one of an output terminal 38o of the controller 33 and an output terminal 78o of the write register 32o to an input terminal 21'o of the controller 18'.

Note that data output to the output terminal 38e and 78e are written in those memory cells, of the memory cell array, whose least significant bits A0 are "0". This is because the output terminals 38e and 78e are connected to the data line BUS0. Similarly, data output to the output terminals 38o and 78o are written in those memory cells, of the memory cell array, whose least significant bits A0 are "1". This is because the output terminal 38o and 78o are connected to the data line BUS1.

The priority function multiplexer 74 is controlled in accordance with the logic levels of the detection signals even1-hit/miss, even2-hit/miss, odd1-hit/miss, and odd2-hit/miss.

If detection signal even1-hit/miss="H", the output terminal 38e of the controller 33 is connected to the input terminal 21'e of the controller 18'.

If detection signal odd1-hit/miss="H", the output terminal 38o of the controller 33 is connected to the input terminal 21'o of the controller 18'.

If detection signal even2-hit/miss="H", the output terminal 78e of the write register 32e is connected to the input terminal 21'e of the controller 18'.

If detection signal odd2-hit/miss="H", the output terminal 78o of the write register 32o is connected to the input terminal 21'o of the controller 18'.

The controller 18' is a circuit identical to the read data line controller 18. The controller 18' is connected by a control signal RBC' in the same manner as the read data line controller 18. A first output terminal 24'u of the controller 18' is connected to the input terminal of a read register 19'u. A second output terminal 24'd is connected to the input terminal of a read register 19'd.

The read register 19'u stores data output to the first output terminal 24'u. The read register 19'd stores data output to the second output terminal 24'd. Each of the read registers 19'u and 19'd outputs the stored read data in synchronism with the up-edge of the operation clock CK. Outputs from the read registers 19'u and 19'd are input to the multiplexer 75 described above.

The multiplexer 75 connects one of the outputs from the read registers 19u and 19'u to an input terminal of an output transfer gate 20u. The multiplexer 75 also connects one of the outputs from the read registers 19d and 19'd to an input terminal of an output transfer gate 20d.

The multiplexer 75 is controlled in accordance with the logic levels of the least significant bits A0, the detection signals even-hit/miss and odd-hit/miss.

An example of control will be described below.

If detection signal even-hit/miss="H" level, the output of the read register 19'u is connected to the input of the transfer gate 20u, and detection signal even-hit/miss="L" level, the output of the read register 19u is connected to the input of the transfer gate 20u.

If detection signal odd-hit/miss="H" level, the output of the read register 19'd is connected to the input of the transfer gate 20d, and detection signal odd-hit/miss="L" level, the output of the read register 19d is connected to the input of the transfer gate 20d.

According to the synchronous SRAM having this arrangement, the write data stored in the write registers 31u and 31d correspond to the write addresses stored in the write address register 66, and the write data stored in the write registers 32e and 32o correspond to the write addresses stored in the write address register 67.

When, therefore, read addresses hit the write addresses in the write address register 66, the data in the write registers 31u and 31d are read out. When the read addresses hit the write addresses in the write address register 67, the data in the write registers 32e and 32o are read out. With this operation, data can be read out before they are written in the SRAM core 2, and hence data coherency can be maintained.

In the second embodiment, each of the write address registers 66 and 67 outputs the stored write address in synchronism with an up-edge of a write operation clock CKW. Each of the write resisters 31u, 31e and 32o outputs the stored write data in synchronism with the up-edge of the clock CKW. Further, the write register 31d outputs the stored write data in synchronism with a write inversion operation clock /CKW. These clocks CKW, /CKW are generated by a write clock buffer 77 placed in the chip, as shown in FIG. 20. The clock buffer 77 generates the clocks CKW, /CKW from an external clock CKext accordance with the signal Wo.

In the second embodiment, the priority function multiplexer 74 is placed near the output terminals of the write data line controller 33 and write registers 32e and 32o. The multiplexer 75 is placed near the output terminals of the read data line controllers 18 and 18'. Such an arrangement is preferably employed to reduce signal interconnection areas.

The synchronous SRAM of the second embodiment can maintain data coherency. This will be described next.

Figure 22A:
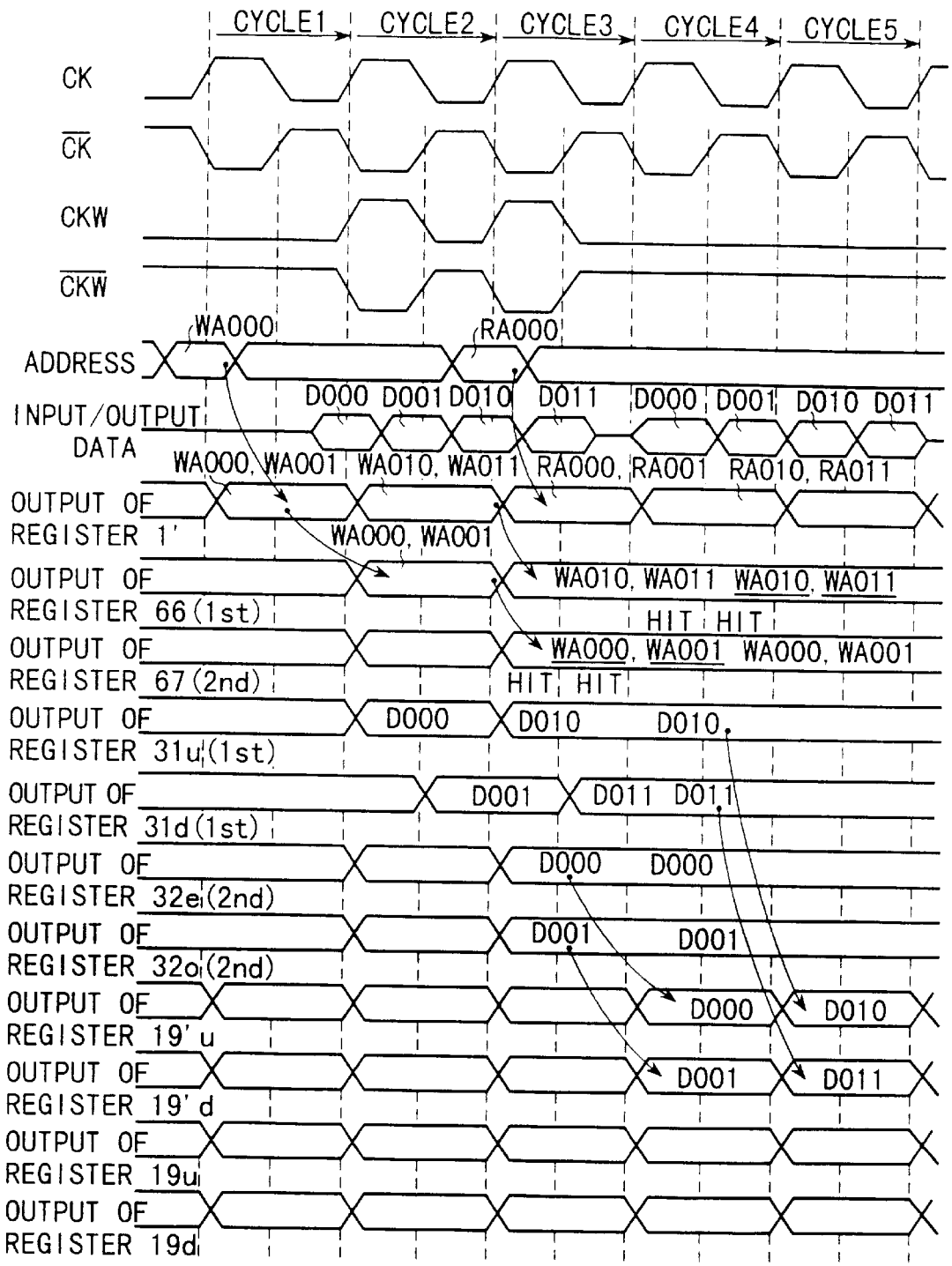
FIGS. 22A and 22B are timing charts each showing the operation of the synchronous DRAM according to the second embodiment of the present invention.

FIG. 22A shows a case wherein read addresses hit both the even-numbered and odd-numbered addresses in the second-stage write address register 67. Assume that the least significant bit A0 of write address is "0", and the data in the write address registers 31u and 31d are respectively output to the first and second output terminals 38e and 38o.

Assume that read addresses RA000 and RA001 hit write addresses WA000 and WA001 in the register 67 in cycle 3, as shown in FIG. 22A.

Figure 23A:
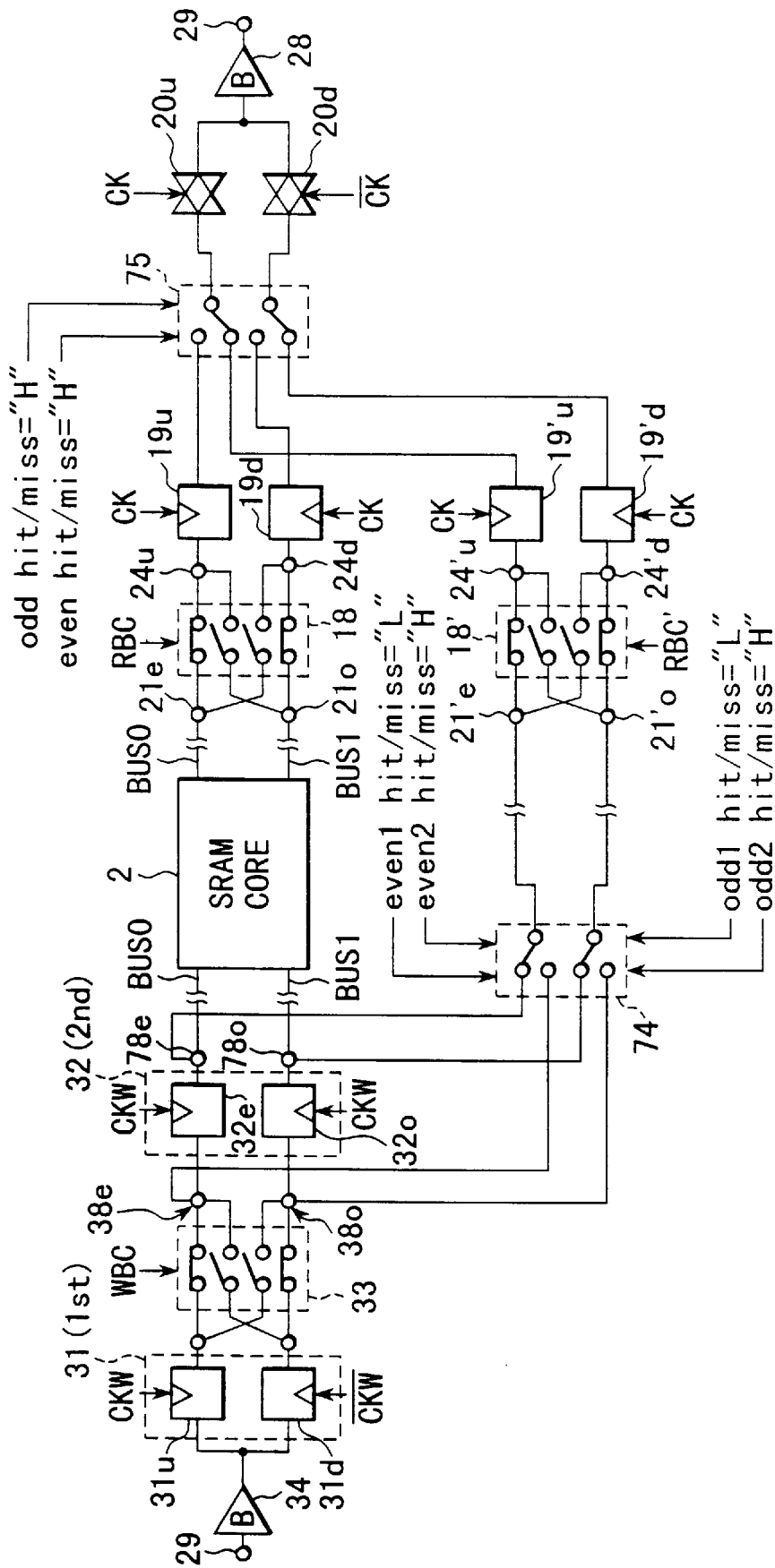
FIGS. 23A, 23B, 23C and 23D are circuit diagrams each showing the operation of the synchronous DRAM according to the second embodiment of the present invention.

In this case, the detection signals even2-hit/miss and odd2-hit/miss are set at "H" level, as shown in FIG. 23A. The multiplexer 74 connects the output terminal 78e to the input terminal 21'e of the controller 18'. The multiplexer 74 connects the output terminal 78o to the input terminal 21'o of the controller 18'. The least significant bit A0 of read address is "0". The controller 18' therefore supplies the data at the input terminals 21'e and 21'o to the read registers 19'u and 19'd, respectively.

The detection signals even-hit/miss and odd-hit/miss are also set at "H" level. The multiplexer 75 respectively supplies outputs from the read registers 19'u and 19'd to the input terminals of the transfer gates 20u and 20d.

In this fashion, for example, in cycle 4, the data stored in the write registers 32e and 32o (these data correspond to read addresses RA000 and RA001) are read out, thus maintaining data coherency.

Note that FIG. 22A also shows a case wherein read addresses hit both even-numbered address and odd-numbered address in the first-stage write address register 66 in cycle 4.

Figure 23B:
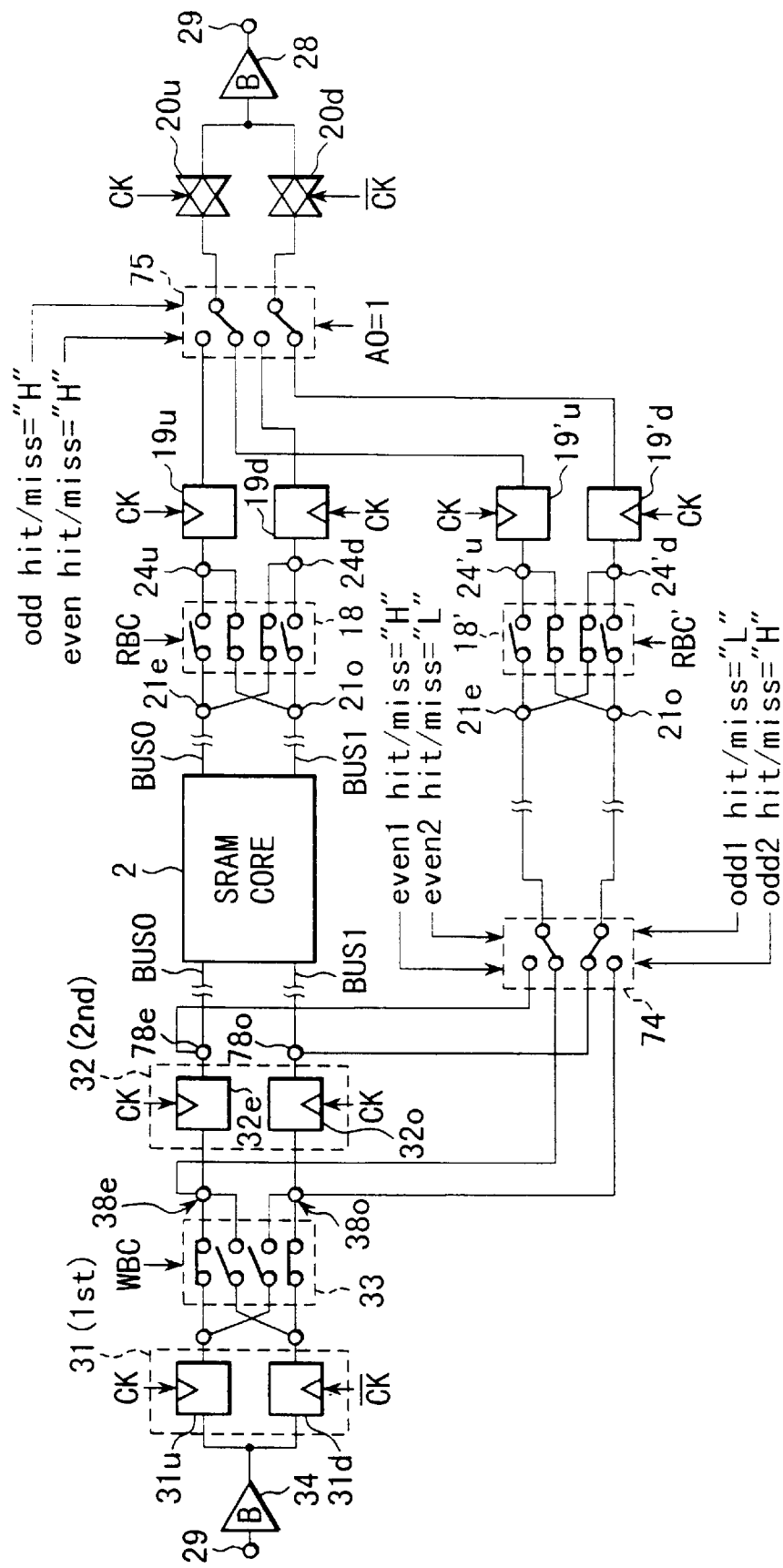

Assume that read address RA010 and RA001 hit write addresses WA010 and WA011 in the register 66 in cycle 4, as shown in FIG. 22A. In this case, the detection signals even1-hit/miss and odd1-hit/miss are set at "H" level, as shown in FIG. 23B. The multiplexer 74 connects the output terminals 38e to the input terminals 21'e of the controller 18'. The multiplexer 74 connects the output terminals 38o to the input terminals 21'o of the controller 18'. The least significant bit A0 of read address is "0". The controller 18' therefore supplies data at the input terminals 21'e and 21'o to the read registers 19'u and 19'd, respectively.

The detection signals even-hit/miss and odd-hit/miss are also set at "H" level. The multiplexer 75 respectively supplies outputs from the read registers 19'u and 19'd to the input terminals of the transfer gates 20u and 20d.

In this manner, for example, in cycle 5, the data stored in the write registers 31u and 31d (these data correspond to read addresses RA010 and RA011) are read out, thus maintaining data coherency.

Figure 22B:
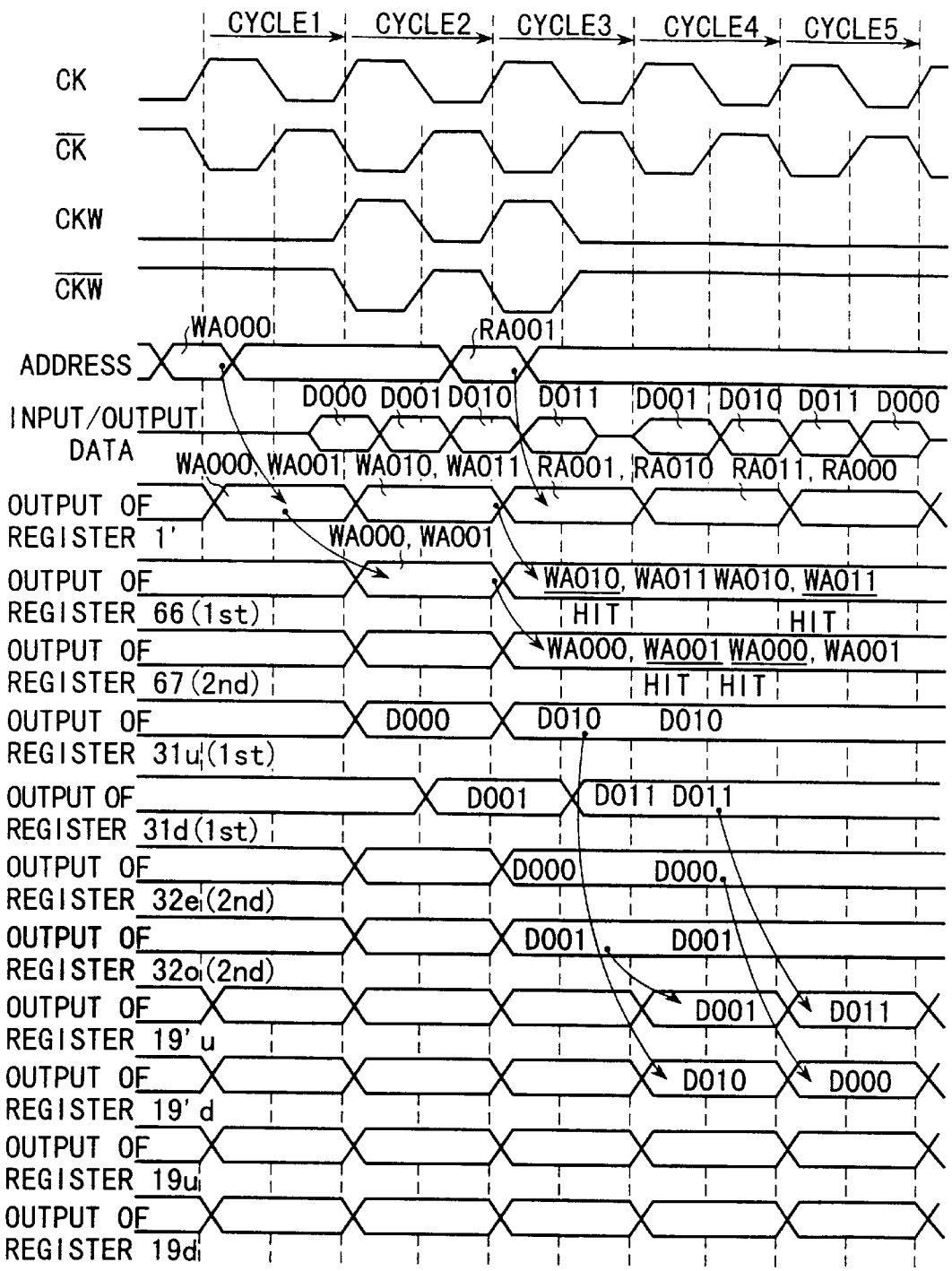

FIG. 22B shows a case wherein a read address hits the odd-numbered address in the second-stage write address register 67 and even-numbered address in the first-stage write address register 66.

Assume that read address RA001 hits write address WA001 in the register 67 in cycle 3, and read address RA010 hits write address WA010 in the register 66 in cycle 3, as shown in FIG. 22B.

Figure 23C:
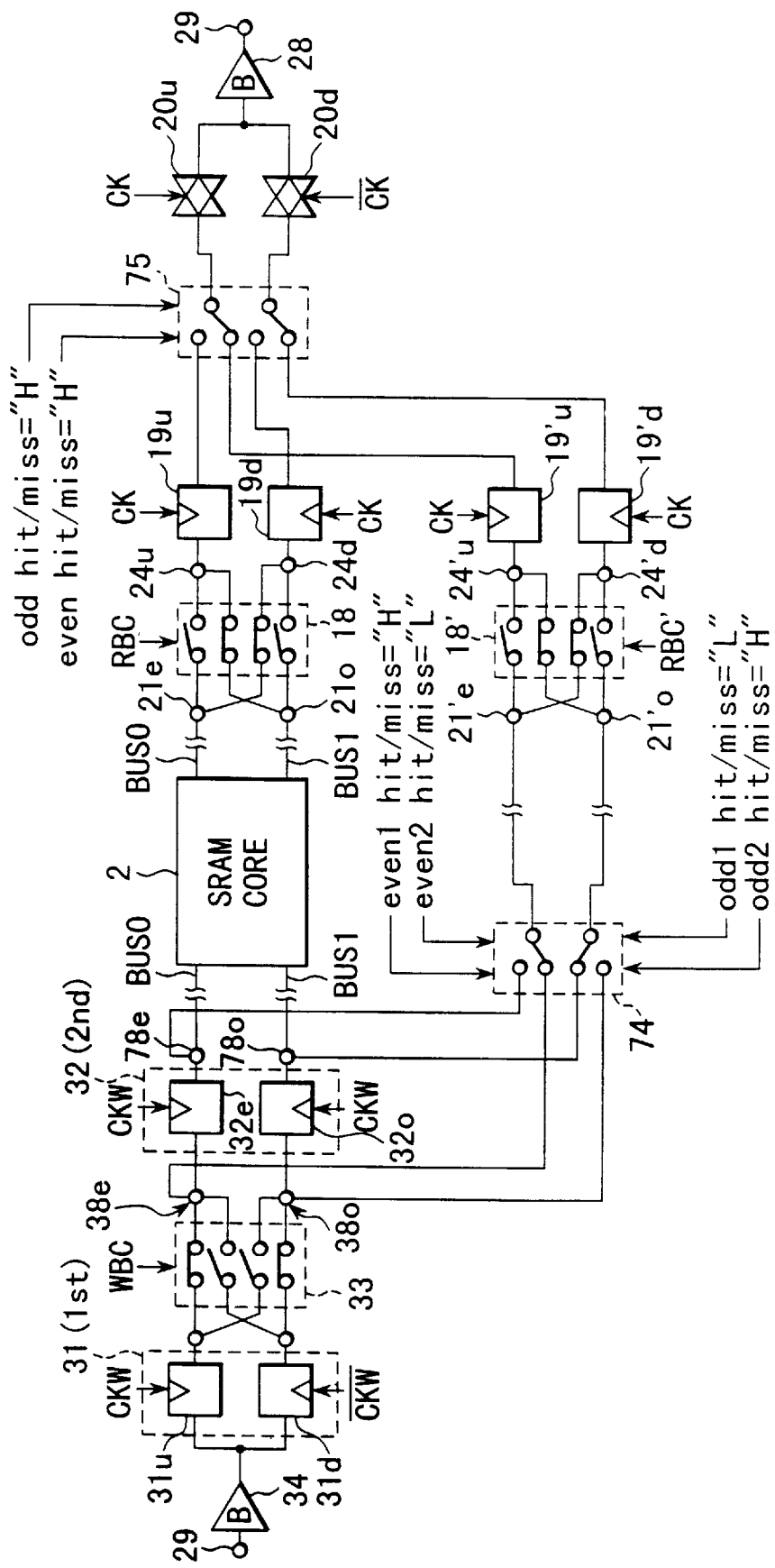

In this case, the detection signals odd2-hit/miss and even1-hit/miss are set at "H" level, as shown in FIG. 23C. The multiplexer 74 connects the output terminal 78o to the input terminal 21'o of the controller 18'. The multiplexer 74 connects the output terminal 38e to the input terminal 21'e of the controller 18'. The least significant bit A0 of read address is "1". The controller 18' therefore supplies the data at the input terminal 21'o to the read register 19'u and the data at input terminal 21'e to the read register 19'd.

The detection signals even-hit/miss and odd-hit/miss are also set at "H" level. The multiplexer 75 respectively supplies outputs from the read registers 19'u and 19'd to the input terminals of the transfer gates 20u and 20d.

In this fashion, for example, in cycle 4, the data stored in the write registers 31u and 32o (these data correspond to read addresses RA010 and RA001) are read out, thus maintaining data coherency.

Note that FIG. 22B also shows a case wherein a read address hits the odd-numbered address in the first-stage write address register 66 and even-numbered address in the second-stage write address register 67.

Assume that read address RA011 hits write address WA011 in the register 66 in cycle 4, and read address RA000 hits write address WA000 in the register 67 in cycle 4, as shown in FIG. 22B.

Figure 23D:
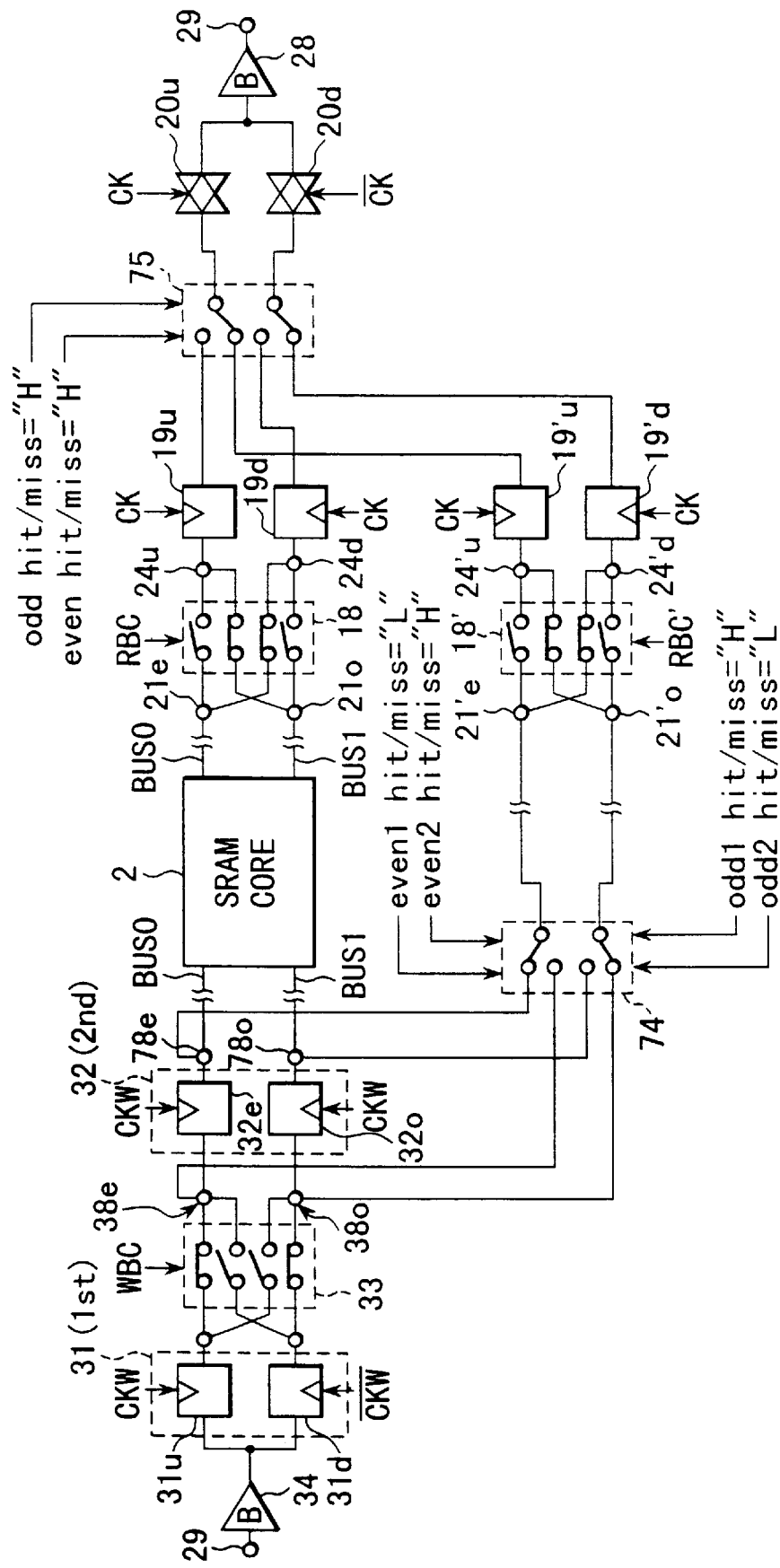

In this case, the detection signals odd1-hit/miss and even2-hit/miss are set at "H" level, as shown in FIG. 23D. The multiplexer 74 connects the output terminal 78e to the input terminal 21'e of the controller 18'. The multiplexer 74 connects the output terminal 38o to the input terminal 21'o of the controller 18'. The least significant bit A0 of read address is "1". The controller 18' therefore supplies the data at the input terminal 21'o to the read register 19'u and the data at input terminal 21'e to the read register 19'd.

The detection signals even-hit/miss and odd-hit/miss are also set at "H" level. The multiplexer 75 respectively supplies outputs from the read registers 19'u and 19'd to the input terminals of the transfer gates 20u and 20d.

In this fashion, for example, in cycle 5, the data stored in the write registers 31d and 32e (these data correspond to read addresses RA011 and RA000) are read out, thus maintaining data coherency.

Read addresses do not hit any of the addresses in the address registers 66 and 67.

In this case, all the detection signals even1-hit/miss, odd1-hit/miss, even2-hit/miss, odd2-hit/miss, even-hit/miss, and odd-hit/miss are set at "L" level. The multiplexer 75 supplies the data read out from the SRAM core 2 and stored in read registers 19u and 19d to the transfer gates 20u and 20d.

Furthermore, in the example above-described, the multiplexer 75 is controlled by the detection signals even-hit/miss and odd-hit/miss. The multiplexer 75 can also be controlled further using the least significant bit A0 in addition to detection signals even-hit/miss and odd-hit/miss.

[Address Comparison Circuit]

Figure 24:
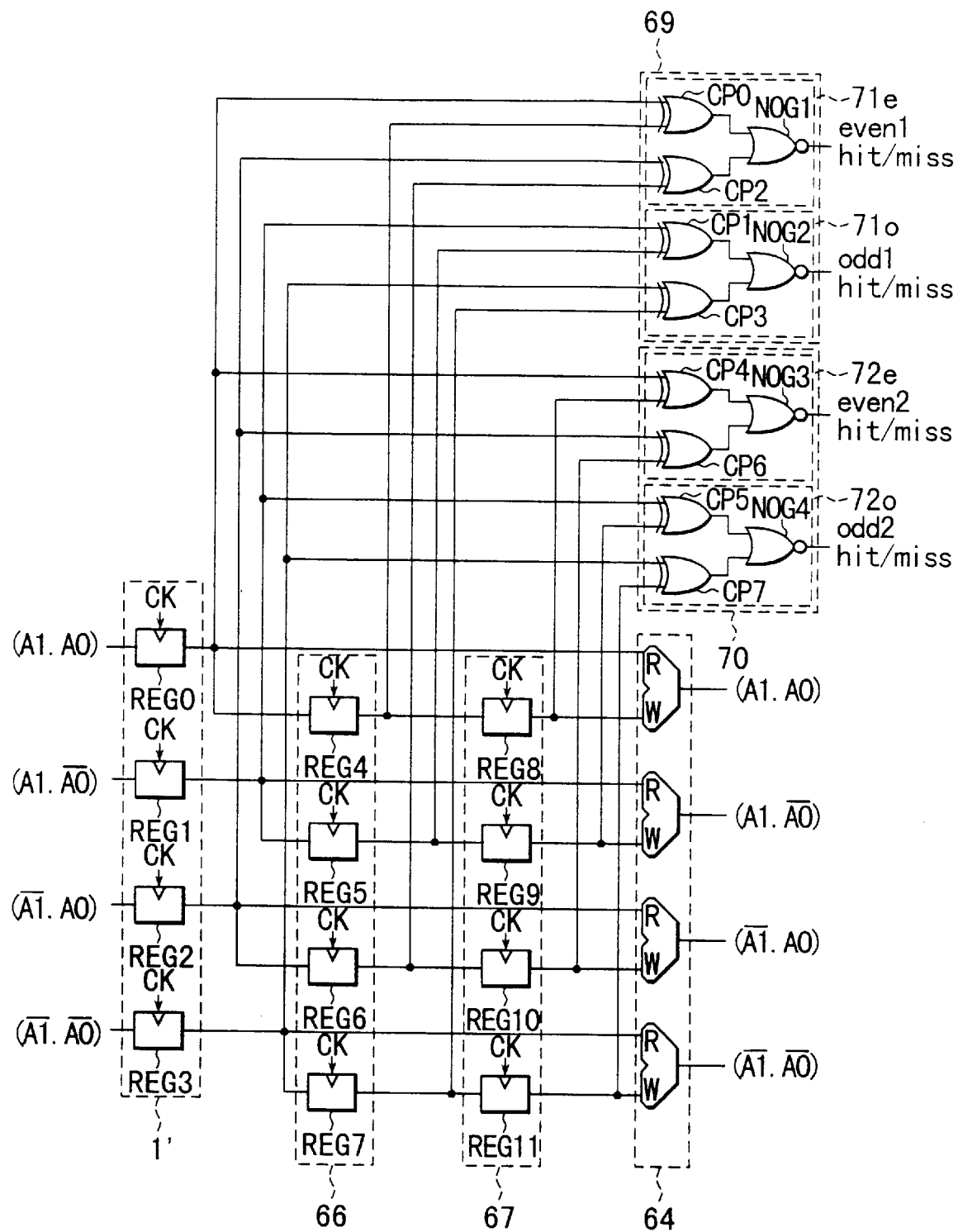
FIG. 24 is a block diagram showing one arrangement of an address coincidence/incoincidence comparison circuit in FIG. 20.

FIG. 24 is a circuit diagram showing are circuit arrangement of the address register 1', the write address register 65, and the address comparison circuit 68. For the sake of simplicity, FIG. 24 shows a case wherein each address consists of two bits.

As shown in FIG. 24, pre-decoded addresses (A1, A0), (A1, /A0), (/A1, A0), and (/A1, /A0) output from the multiplexer 63 are supplied to the address register 1'. The multiplexer 63 includes multiplex circuits MPX0 to MPX3, as shown in FIG. 21A. When the burst address counter 16 operates (e.g., in the burst mode), the multiplexer 63 selects pre-decoded addresses from the pre-decoder 62 and supplies them to the address register 1'. In other cases, the multiplexer 63 selects pre-decoded addresses from the pre-decoder 61 and supplies them to the address register 1'.

The address register 1' outputs the supplied pre-decoded addresses (A1, A0), (A1, /A0), (/A1, A0), and (/A1, /A0) in synchronism with the operation clock CK. The address register 1' includes registers REG0 to REG3 corresponding to the four pre-decoded addresses. Outputs from the registers REG0 to REG3 are respectively supplied to the first input terminals of comparison circuits CP0 to CP7. Each of the comparison circuits CP0 to CP7 is formed from, for example, an exclusive OR circuit. Outputs from registers REG4 to REG7 of the write address register 66 are respectively supplied to the second input terminals of the comparison circuits CP0 to CP3. Outputs from registers REG8 to REG11 of the write address register 67 are respectively supplied to the second input terminals of the comparison circuits CP4 to CP7.

The comparison circuits CP0 to CP3 respectively compare the outputs from the registers REG0 to REG3 with the outputs from the registers REG4 to REG7. The comparison circuits CP0 and CP2 detect coincidence/incoincidence between even-numbered addresses (A0=0). The comparison circuits CP1 and CP3 detect coincidence/incoincidence between odd-numbered addresses (A0=1).

Similarly, the comparison circuits CP4 to CP7 respectively compare the outputs from the registers REG0 to REG3 with the outputs from the registers REG8 to REG11. The comparison circuits CP4 and CP6 detect coincidence/incoincidence between even-numbered addresses (A0=0). The comparison circuits CP5 and CP7 detect coincidence/incoincidence between odd-numbered addresses (A0=1).

In this case, it suffices to obtain one detection result about coincidence/incoincidence between the even-numbered addresses. Therefore, the outputs from the comparison circuits CP0 and CP2 are combined into one output by a NOR circuit NOG1. The NOR circuit NOG1 outputs the signal even1-hit/miss. Likewise, it suffices to obtain one detection result about coincidence/incoincidence between the odd-numbered addresses. The outputs from the comparison circuits CP1 and CP3 are combined into one output by a NOR circuit NOG2. The NOR circuit NOG2 outputs the signal odd1-hit/miss. The outputs from the comparison circuits CP4 and CP6 are combined into one output by a NOR circuit NOG3. The NOR circuit NOG3 outputs the signal even2-hit/miss. The outputs from the comparison circuits CP5 and CP7 are combined into one output by a NOR circuit NOG4. The NOR circuit NOG4 outputs the signal odd2-hit/miss.

A modification of the address comparison circuit will be described next.

This modification is associated with a case wherein the synchronous SRAM is designed to perform only DDR operation and the interleaved mode.

In this case, as shown in FIG. 8D, only two combinations of (0, 0) and (0, 1), and (1, 0) and (1, 1) are present as two consecutive burst addresses. That is, in one clock cycle, the burst address bit A1 is "0" or "1". For this reason, write and read addresses can be compared without comparing the least significant bits A0.

With this operation, of the comparison circuits CP0 to CP3 shown in FIG. 24, the comparison circuits CP0 and CP1 can be reduced into one circuit, and the comparison circuits CP2 and CP3 can be reduced into one circuit. The respective comparison results can be combined into one by one NOR circuit to output the detection signal odd1-hit/miss.

With this arrangement, one of the comparison circuits CP0 and CP1, one of the comparison circuits CP2 and CP3, and one of the NOR circuits NOG1 and NOG2 can be omitted. This can simplify the circuit arrangement of the address comparison circuit 68.

[Third Embodiment]

The second embodiment includes the second read data line controller 18'. In the second embodiment, therefore, the circuit pattern area increases by an area corresponding to the controller 18'. An increase in circuit pattern area leads to an increase in chip size and hence is preferably suppressed.

It is an object of the third embodiment to suppress an increase in circuit pattern area.

Figure 25:
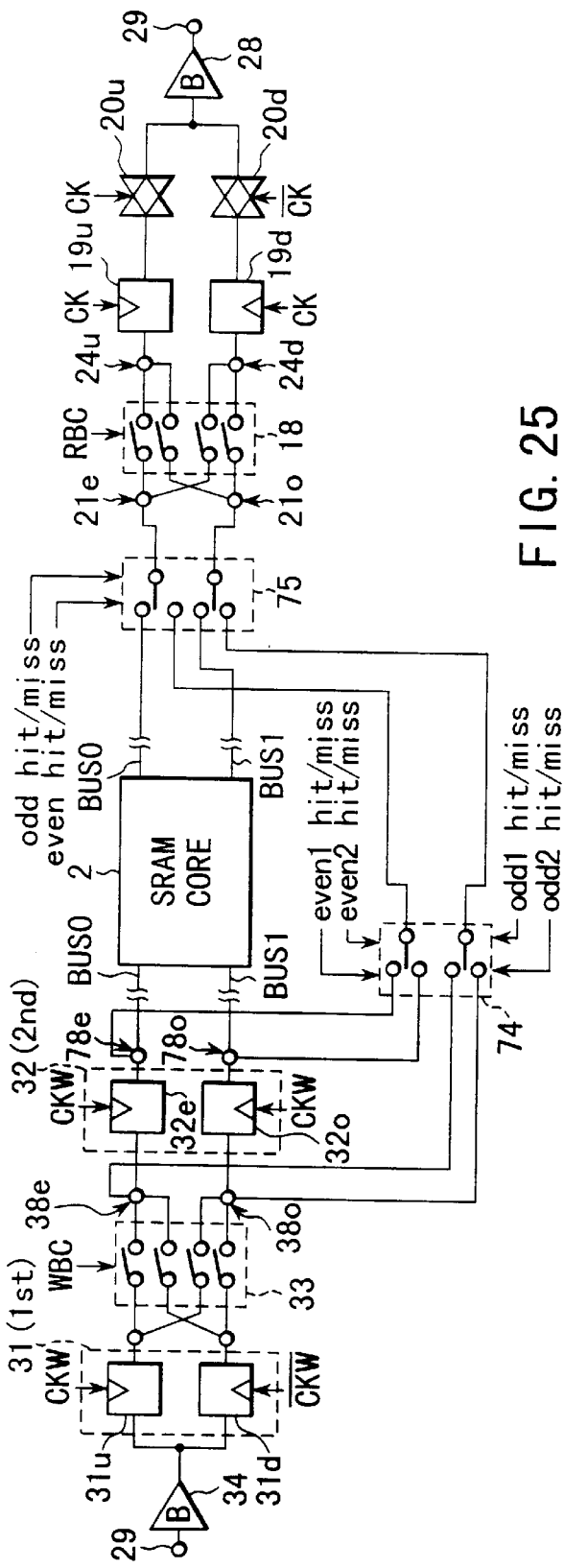
FIG. 25 is a block diagram showing a synchronous SRAM according to the third embodiment of the present invention.

FIG. 25 is a block diagram showing the arrangement of a synchronous SRAM according to the third embodiment.

As shown in FIG. 25, in the third embodiment, outputs from an SRAM core 2 and a priority function multiplexer 74 are supplied to a multiplexer 75. An output from the multiplexer 75 is supplied to a read data line controller 18.

According to the third embodiment, the second read bus controller 18' in the second embodiment can be omitted, and hence an increase in circuit pattern area can be suppressed.

In the third embodiment, the priority function multiplexer 74 is placed near the output terminals of a write data line controller 33 and write registers 32e and 32o, and the multiplexer 75 is placed near the input terminal of the read data line controller 18. Such an arrangement is preferably employed to reduce the signal interconnection areas.

[Fourth Embodiment]

It is an object of the fourth embodiment to further suppress an increase in circuit pattern area.

Figure 26:
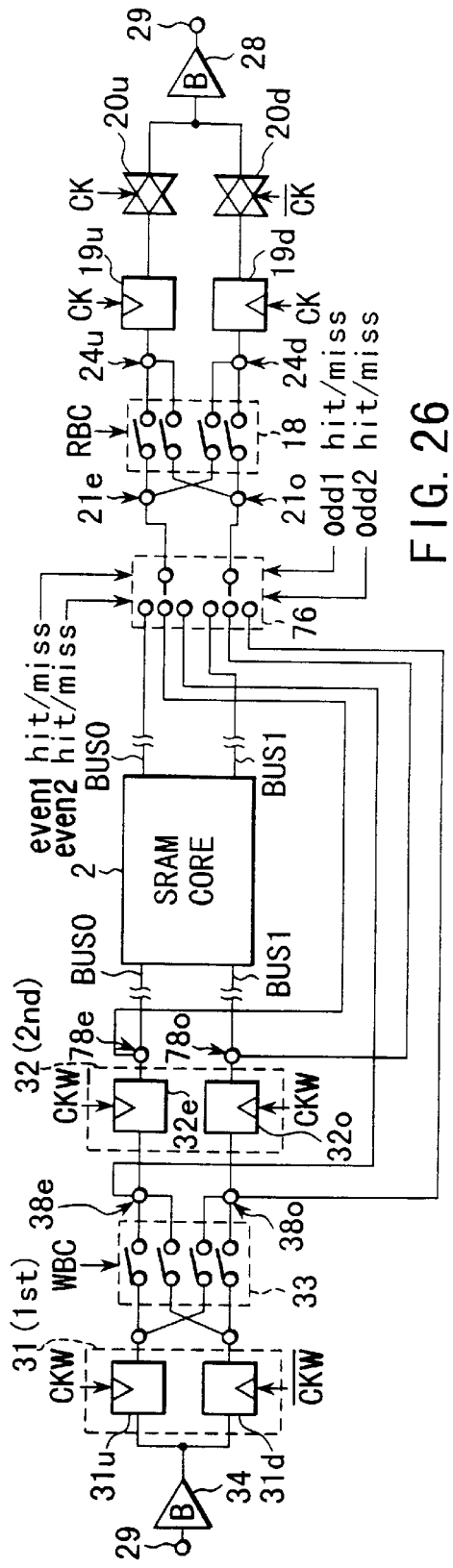
FIG. 26 is a block diagram showing a synchronous SRAM according to the fourth embodiment of the present invention.

FIG. 26 is a block diagram showing the arrangement of the synchronous SRAM according to the fourth embodiment.

As shown in FIG. 26, in the fourth embodiment, outputs from an SRAM core 2, a write data line controller 33, and write registers 32e and 32o are supplied to a multiplexer 76. The multiplexer 76 is controlled by the detection signals even1-hit/miss, odd1-hit/miss, even2-hit/miss, and odd2-hit/miss. An output from the multiplexer 76 is supplied to a read data line controller 18.

According to the fourth embodiment, the second read data line controller 18' and the priority function multiplexer 74 in the third embodiment can be omitted, and hence an increase in circuit pattern area can be further suppressed.

The present invention has been described above by taking a synchronous SRAM capable of selecting the DDR or SDR scheme as an example. However, the present invention can be applied to a synchronous SRAM designed to operated only in the DDR scheme. In addition, the SRAM has been exemplified as a memory. However, the present invention can be applied to memories other than the SRAM, e.g., a DRAM.

In the above embodiment, the read data line controller 18 is inserted before the sense amplifiers 26u and 26d, the write data line controller 33 is inserted before the write registers 32e and 32o. However, it suffices if the controller 18 is inserted before the read registers 19u and 19d. For example, the controller 18 may be inserted after the sense amplifiers 26u and 26d. Similarly, it suffices if the controller 33 is inserted after the write registers 31u and 31d. For example, the controller 33 may be inserted after the write registers 32e and 32o.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a memory cell array including at least first and second memory cell groups;
   at least first and second data lines;
   a data transfer circuit capable of at least respectively connecting memory cells included in said first and second memory cell groups to said first and second data line; and
   a data output circuit including at least first and second output transfer circuits and a read data line control circuit, said first output transfer circuit being adapted to transfer first output data sent to one of said first and second data lines at a first timing, said second output transfer circuit being adapted to transfer second output data lines at a second timing different from said first timing, said read data line control circuit capable of selectively connecting said first data line to one of said first and second output transfer circuits, and selectively connecting said second data line to one of said first and second output transfer circuits in accordance with an input address and a signal to designate one of an SDR scheme and a DDR scheme.

2. The semiconductor integrated circuit device according to claim 1, wherein said data output circuit is controlled by an operation clock, the first timing is one of up-edge and down-edge of the operation clock, and the second timing is the other of the up-edge and down-edge of the operation clock.

3. The semiconductor integrated circuit device according to claim 2, wherein said read data line control circuit connects said first data line to one of said first and second output transfer circuits and connects said second data line to the other of said first and second output transfer circuits in accordance with an output order of the first and second output data.

4. The semiconductor integrated circuit device according to claim 3, wherein the output order of the first and second output data is determined by the input address.

5. The semiconductor integrated circuit device according to claim 4, wherein the input address has a plurality of bits, and a bit, of the plurality of bits, which designates said first memory cell group or said second memory cell group determines the output order of the first and second output data.

6. The semiconductor integrated circuit device according to claim 5, wherein when a read scheme for the first and second output data is a burst read scheme, the input address is a burst start address.

7. The semiconductor integrated circuit device according to claim 5, wherein an output scheme for the first and second output data is device according to claim 5, wherein an output scheme for the first and second output data is the DDR scheme.

8. The semiconductor integrated circuit device according to claim 2, wherein said read data line control circuit connects said first data line to at least one of said first and second output transfer circuits and then connects said second data line to at least the other of said first and second output transfer circuits in accordance with an output order of the first and second output data.

9. The semiconductor integrated circuit device according to claim 8, wherein the output order of the first and second output data is determined by the input address.

10. The semiconductor integrated circuit device according to claim 9, wherein the input address has a plurality of bits, and a bit, of the plurality of bits, which designates said first memory cell group or said second memory cell group determines the output order of the first and second output data.

11. The semiconductor integrated circuit device according to claim 10, wherein when a read scheme for the first and second output data is a burst read scheme, the input address is a burst start address.

12. The semiconductor integrated circuit device according to claim 10, wherein an output scheme for the first and second output data is the SDR scheme.

13. A semiconductor integrated circuit device comprising:
a memory cell array including at least first and second memory cell groups;
at least first and second data lines;
a data transfer circuit capable of at least respectively connecting memory cells included in said first and second memory cell groups to said first and second data line; and
a data output circuit including at least first and second input register circuits, a write data line control circuit, said first input register circuit storing first input data at a first timing, and said second input register circuit storing second input data at a second timing different from said first timing, said write data line control circuit capable of selectively connecting said first input register circuit to one of said first and second data lines, and selectively connecting said second input register circuit to one of said first and second data lines in accordance with an input address and a signal to designate one of an SDR scheme and a DDR scheme.

14. The semiconductor integrated circuit device according to claim 13, wherein said data output circuit is controlled by an operation clock, the first timing is one of up-edge and down-edge of the operation clock, and the second timing is the other of the up-edge and down-edge of the operation clock.

15. The semiconductor integrated circuit device according to claim 14, wherein said write data line control circuit connects said first input register circuit to one of said first and second data lines and connects said second input register circuit to the other of said first and second data lines in accordance with the input address.

16. The semiconductor integrated circuit device according to claim 15, wherein the input address has a plurality of bits, and a bit, of the plurality of bits, which designates said first memory cell group or said second memory cell group determines the output order of the first and second input data.

17. The semiconductor integrated circuit device according to claim 16, wherein when a read scheme for the first and second output data is a burst read scheme, the input address is a burst start address.

18. The semiconductor integrated circuit device according to claim 16, wherein an input scheme for the first and second input data is the DDR scheme.

19. The semiconductor integrated circuit device according to claim 13, wherein said write data line control circuit separates said second input register circuit from both said first and second data lines when connecting said first input register circuit to both said first and second data lines.

20. The semiconductor integrated circuit device according to claim 19, wherein an input scheme for the first and second input data is the SDR scheme.

21. The semiconductor integrated circuit device according to claim 1, further comprising:
a data input circuit including at least first and second input register circuits, a write data line control circuit, said first input register circuit storing first input data at a third timing, and said second input register circuit storing second input data at a fourth timing different from said third timing, said write data line control circuit capable of selectively connecting said first input register circuit to one of said first and second data lines, and selectively connecting said second input register circuit to one of said first and second data lines in accordance with an input address and a signal to designate one of an SDR scheme and a DDR scheme;
an address register for storing the input address;
a write address register for or, went he input address is a write address, storing the write address;
a comparison circuit for, when the input address is a read address, comparing the read address with the write address and detecting a coincidence/incoincidence; and
a multiplexer for, when the read address coincides with the write address, connecting outputs of said first and second input register circuits to one of said first and second output transfer circuits.

22. The semiconductor integrated circuit device according to claim 21, wherein said comparison circuit comprises an even-numbered address comparison circuit and an odd-numbered address comparison circuit.

23. The semiconductor integrated circuit device according to claim 22, wherein said multiplexer selects one of the outputs of said first and second input register circuits when the even-numbered addresses of the read and write addresses coincide with each other, and selects the other of the outputs of said first and second input register circuits when the odd-numbered addresses of the read and write addresses coincide with each other.

24. The semiconductor integrated circuit device according to claim 21, wherein said data input circuit comprises a third input register for storing a first output from said write data line control circuit, and a fourth input register for storing a second output from said write data line control circuit, said write address register comprises a first write address register for storing a first write address corresponding to data in said first and second input registers, and second write address register for storing a second write address corresponding to data in said third and fourth input registers, and said comparison circuit comprises a first comparison circuit for comparing the read address with the first write address, and a second comparison circuit for comparing the read address with the second write address.

25. The semiconductor integrated circuit device according to claim 24, wherein said multiplexer selects outputs from said first and second input register circuits when the read address coincides with the first write address, and selects outputs from said third and fourth input register circuits when the read address coincides with the second write address.

26. The semiconductor integrated circuit device according to claim 25, wherein said first comparison circuit comprises a first even-number address comparison circuit and a first odd-numbered address comparison circuit, and said second comparison circuit comprises a second even-numbered address comparison circuit and a second odd-numbered address comparison circuit.

27. The semiconductor integrated circuit device according to claim 26, wherein said multiplexer selects one of the outputs from said first and second input register circuits when the read address and the first write address are even-numbered addresses and coincide with each other, selects the other of the outputs from said first and second input register circuits when the read address and the first write address are odd-numbered addresses and coincide with each other, selects one of the output from said third and fourth input register circuits when the read address and the second write address are even-numbered addresses and coincide with each other, and selects the other of the outputs from said third and fourth input register circuits when the read address and the second write address are odd-numbered addresses and coincide with each other.

28. A semiconductor integrated circuit device comprising:

a memory cell array including at least first and second memory cell groups;

at least first and second data lines;

a data transfer circuit capable of at least respectively connecting memory cells included in said first and second memory cell groups to said first and second data line; and a data input/output circuit including at least first and second output transfer circuit adapted to transfer first data to or from one of said first and second data lines at a first timing, and said second transfer circuit adapted to transfer second data to or from the other of first and second data lines at a second timing different from the first timing, said data line control circuit capable of selectively connecting said first data line to one of said first and second transfer circuit, and selectively connecting said second data line to one of said first and second data transfer circuit in accordance with an input address and a signal to designate one of an SDR scheme and a DDR scheme.

* * * * *